United States Patent
Chang-Hasnain et al.

(10) Patent No.: US 12,046,873 B2
(45) Date of Patent: Jul. 23, 2024

(54) AIR CAVITY DOMINANT VCSELS WITH A WIDE WAVELENGTH SWEEP

(71) Applicant: THE REGENTS OF THE UNIVERSITY OF CALIFORNIA, Oakland, CA (US)

(72) Inventors: Constance J. Chang-Hasnain, Palo Alto, CA (US); Kevin T. Cook, Berkeley, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 897 days.

(21) Appl. No.: 17/090,762

(22) Filed: Nov. 5, 2020

(65) Prior Publication Data

US 2021/0135430 A1 May 6, 2021

Related U.S. Application Data

(63) Continuation of application No. PCT/US2019/031153, filed on May 7, 2019.

(Continued)

(51) Int. Cl.
*H01S 5/183* (2006.01)
*H01S 5/068* (2006.01)
*H01S 5/34* (2006.01)

(52) U.S. Cl.
CPC .......... *H01S 5/18363* (2013.01); *H01S 5/068* (2013.01); *H01S 5/18313* (2013.01); *H01S 5/34* (2013.01)

(58) Field of Classification Search
CPC .. H01S 5/18363; H01S 5/068; H01S 5/18313; H01S 5/34; H01S 5/04257;

(Continued)

(56) References Cited

U.S. PATENT DOCUMENTS 5,351,698 A 10/1994 Wheeler
5,896,408 A 4/1999 Corzine
(Continued)

FOREIGN PATENT DOCUMENTS

CN 104488148 A 4/2015
JP 2005159272 A 6/2005
(Continued)

OTHER PUBLICATIONS

State Intellectual Property Office of the People's Republic of China, First office action notification issued Jun. 10, 2023, related Chinese patent application No. 201980030250.0, Chinese language document, pp. 1-13, English language translation, pp. 14-26, claims examined, pp. 27-32.

(Continued)

*Primary Examiner* — Xinning (Tom) Niu
(74) *Attorney, Agent, or Firm* — O'BANION & RITCHEY LLP; John P. O'Banion

(57) ABSTRACT

A widely tunable vertical-cavity surface-emitting laser (VCSEL) having a semiconductor cavity followed by an air-gap over which is a movable reflector. Lasing wavelength is controlled by a combination of the resonance of the semiconductor cavity, which is fixed, and the resonance of the air cavity, which can be changed by moving the reflector. Tuning range and slope of the VCSEL are increased by configuring the semiconductor cavity to be antiresonant at the center of the tuning range, which forces electromagnetic energy to be confined more strongly in the air gap than in the semiconductor, thus making emission wavelength more sensitive to the displacement of the tuning mirror.

19 Claims, 23 Drawing Sheets

Related U.S. Application Data

(60) Provisional application No. 62/668,448, filed on May 8, 2018.

(58) Field of Classification Search
CPC ............. H01S 5/18311; H01S 5/18358; H01S 5/18361; H01S 5/142
See application file for complete search history.

(56) References Cited

U.S. PATENT DOCUMENTS

| | | | |
|---|---|---|---|
| 10,361,539 B2 | 7/2019 | Chang-Hasnain | |
| 2002/0071463 A1 | 6/2002 | Garnache | |
| 2005/0213629 A1* | 9/2005 | Takahashi | H01S 5/187 372/99 |
| 2006/0268398 A1 | 11/2006 | Cole | |
| 2007/0153860 A1* | 7/2007 | Chang-Hasnain | G02B 5/1809 359/558 |
| 2010/0111125 A1* | 5/2010 | Kondo | H01S 5/1833 372/45.01 |
| 2011/0280269 A1* | 11/2011 | Chang-Hasnain | H01S 5/18366 372/50.1 |
| 2014/0268169 A1* | 9/2014 | Jayaraman | H01S 5/18366 372/20 |
| 2015/0010031 A1 | 1/2015 | Makino | |
| 2015/0139260 A1 | 5/2015 | Gerlach | |
| 2015/0146212 A1* | 5/2015 | Matsuu | G01B 9/02004 356/479 |
| 2015/0171597 A1 | 6/2015 | Yvind | |
| 2017/0117684 A1 | 4/2017 | Garnache-Creuillot | |
| 2018/0123319 A1* | 5/2018 | Nagatomo | H01S 5/18316 |
| 2018/0301870 A1 | 10/2018 | Chang-Hasnain | |

FOREIGN PATENT DOCUMENTS

| | | |
|---|---|---|
| WO | 2010017787 A1 | 2/2010 |
| WO | 2011142760 A1 | 11/2011 |
| WO | 2019217444 A1 | 11/2019 |

OTHER PUBLICATIONS

ISA/KR, Korean Intellectual Property Office (KIPO), International Search Report and Written Opinion Issued Aug. 30, 2019, related PCT international application No. PCT/US2019/031153, pp. 1-15, claims searched, pp. 16-21.

Qiao, Pengfei et al., "Wavelength-Swept VCSELs", IEEE Journal of Selected Topics in Quantum Electronics, vol. 23, No. 6, Nov./Dec. 2017, 1700516, 16 pages.

Wu, M.S. et al., "Tunable micromachined vertical cavity surface emitting laser", Electronics Letters, vol. 31, No. 19, Sep. 14, 1995, pp. 1671-1672.

Gierl, C. et al., "Surface micromachined tunable 1.55 um-VCSEL with 102 nm continuous single-mode tuning", Optics Express, vol. 19, No. 18, Aug. 29, 2011, published Aug. 18, 2011, pp. 17336-17343.

* cited by examiner

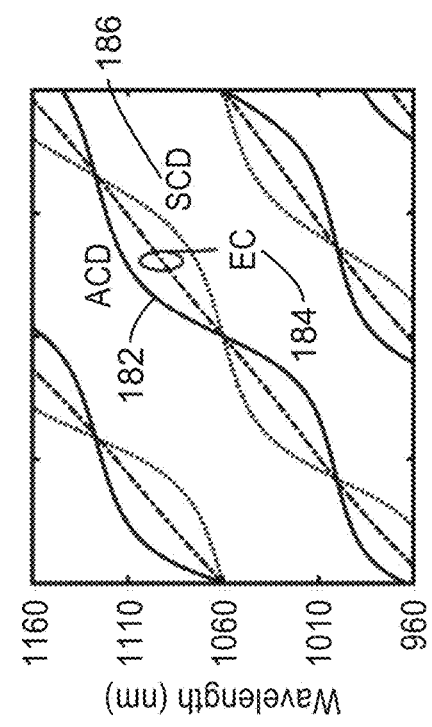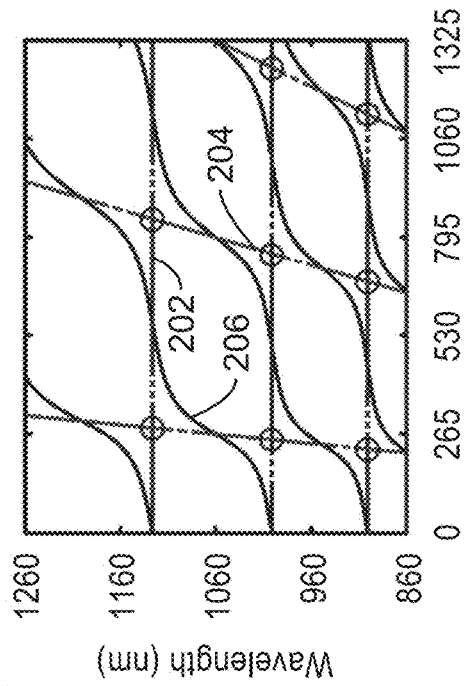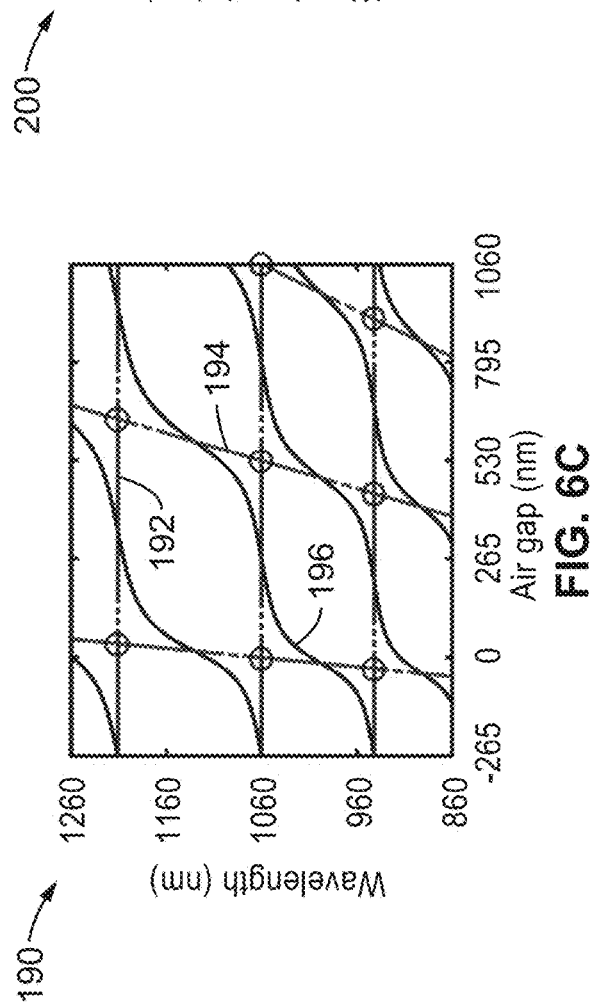
FIG. 6A
FIG. 6B
FIG. 6C
FIG. 6D

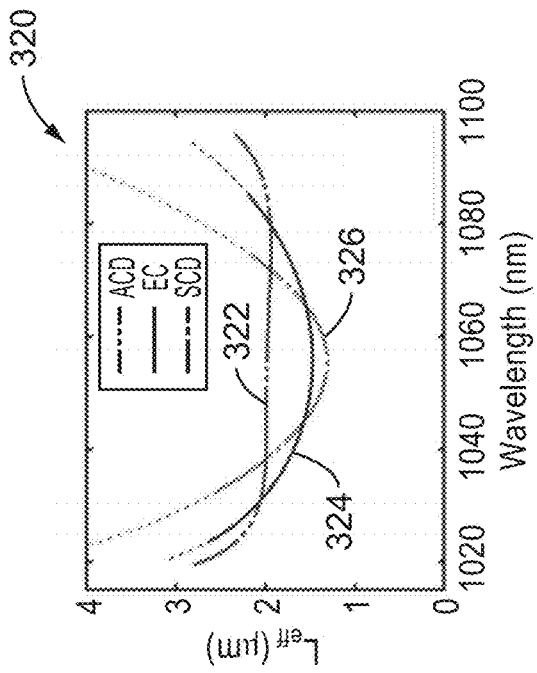
FIG. 9A
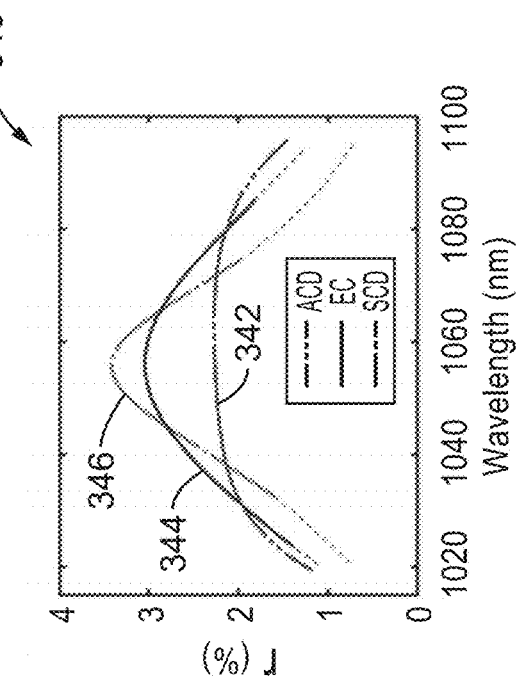
FIG. 9B
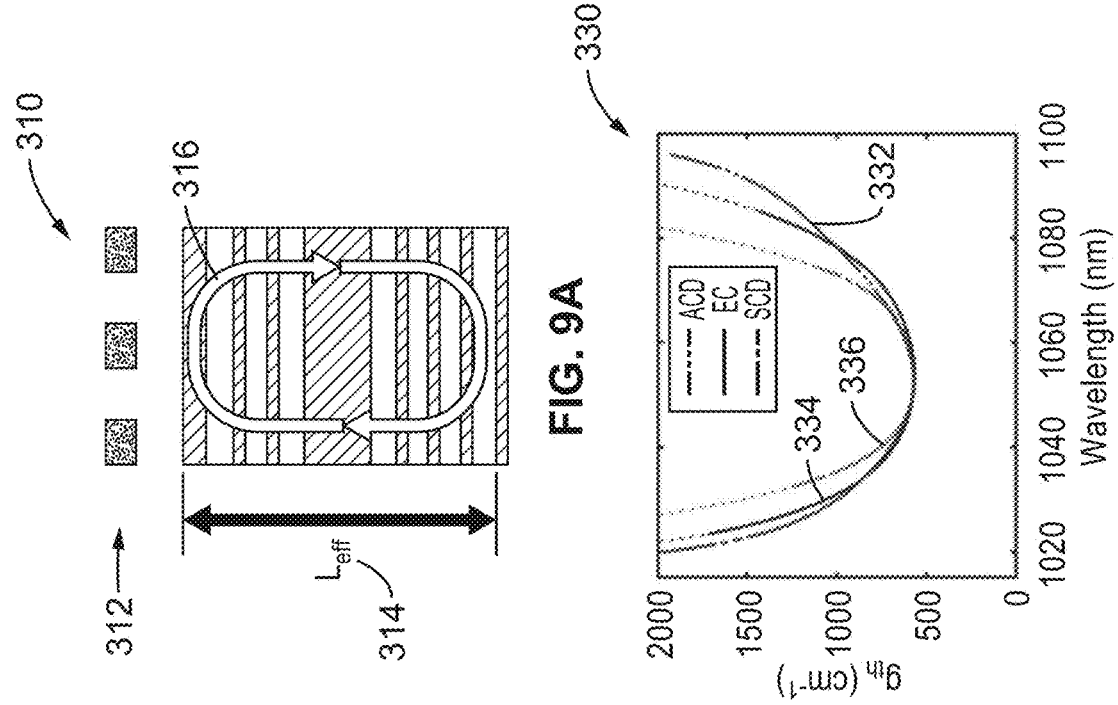
FIG. 9C
FIG. 9D

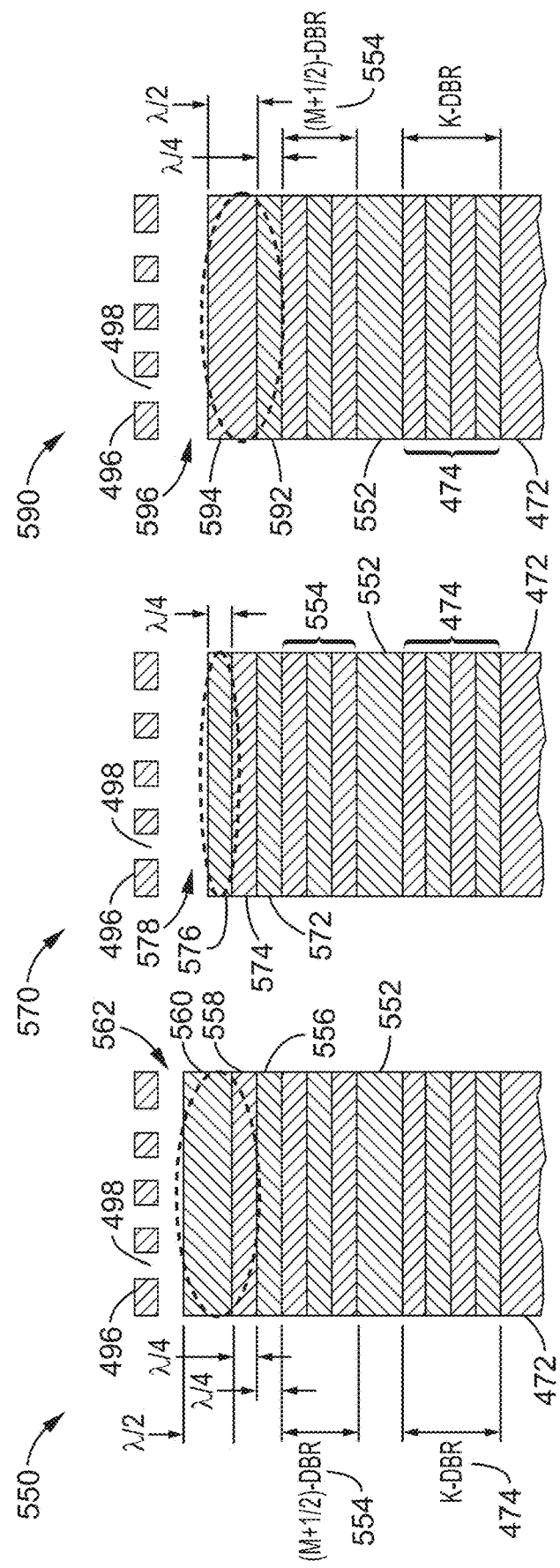

AIR CAVITY DOMINANT VCSELS WITH A WIDE WAVELENGTH SWEEP

CROSS-REFERENCE TO RELATED APPLICATIONS

This application claims priority to, and is a 35 U.S.C. § 111(a) continuation of, PCT international application number PCT/US2019/031153 filed on May 7, 2019, incorporated herein by reference in its entirety, which claims priority to, and the benefit of, U.S. provisional patent application Ser. No. 62/668,448 filed on May 8, 2018, incorporated herein by reference in its entirety. Priority is claimed to each of the foregoing applications.

The above-referenced PCT international application was published as PCT International Publication No. WO 2019/217444 A1 on Nov. 14, 2019, which publication is incorporated herein by reference in its entirety.

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to integrated circuit tunable lasers, and more particularly to a widely tunable vertical-cavity surface-emitting laser (VCSEL) with microelectromechanical systems (MEMS).

2. Background Discussion

Tunable lasers are important light sources as utilized in a number of applications, including telecommunications and ranging. In the field of telecommunications, a tunable laser can be used as a reconfigurable wavelength division multiplexing source, reducing the inventory required within a data center while still covering all channels within a communications band. In the field of ranging, tunable lasers can be used for swept-source optical coherence tomography, a three-dimensional imaging system with medical and industrial applications. The resolution of this technique is inversely proportional to the tuning ratio of a source, defined as the tuning range divided by the wavelength at the center of the tuning range.

Vertical-cavity surface-emitting lasers (VCSELs) with microelectromechanical systems (MEMS) for wavelength tuning exhibit distinct advantages over other types of tunable lasers for many applications, such as those exemplified above. VCSELs are extremely small and inexpensive, saving space and cost in many applications. VCSELs are desirable in telecommunications systems because they intrinsically support a single transverse mode and they have a fast direct modulation rate. VCSELs are desirable in ranging systems for their wide tuning ratio and high continuous wavelength sweep rate, which determines the field of view of the imaging system.

Current tunable VCSELs have a semiconductor cavity resonant at the tuning center providing a semiconductor cavity dominant (SCD) device with limited tuning ratio having a maximum of about 2.1 percent. More recently, tunable VCSELs have been produced with an antireflection coating applied between the semiconductor and air cavities, causing the two cavities to resonate as a single cavity. This configuration, known as the extended cavity (EC) design, led to an increased tuning ratio of 6.6%.

The present disclosure overcomes some of the tuning range limitations of previous VCSELs, while providing additional advantages.

BRIEF SUMMARY

This disclosure describes a widely tunable vertical-cavity surface-emitting laser (VCSEL) which, in one embodiment, comprises a semiconductor cavity and a movable reflector with an air gap between the semiconductor cavity and movable reflector. In one embodiment, the lasing wavelength is controlled by a combination of the resonance of the semiconductor cavity, which is fixed, and the resonance of the air cavity, which can be changed by moving the reflector. Since the resonance of the semiconductor cavity is fixed by the design of the epitaxy, the semiconductor cavity resonance dominates the tuning characteristic of a tunable VCSEL.

Although counterintuitive, it has been found according to the present disclosure that the tuning range and tuning slope of a tunable VCSEL can be maximized by designing the semiconductor cavity to be antiresonant at the center of the tuning range. This design forces the electromagnetic energy to be confined more strongly in the air gap than the semiconductor, which makes the emission wavelength more sensitive to the displacement of the tuning mirror. Since the only requirement is an antiresonant semiconductor cavity, the design is very flexible with respect to material choices and the insertion of layers for other purposes. The increased tuning range makes this VCSEL an attractive source for numerous applications, for example shortwave wavelength division multiplexing (SWDM), swept-source optical coherence tomography (SS-OCT), and frequency-modulated continuous wave light detection and ranging (FMCW LIDAR).

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

FIG. 6A through FIG. 6D are schematic and plots of coupled cavities and comparisons of characteristics according to an embodiment of the present disclosure.

FIG. 9A through FIG. 9D are a schematic and plots of cavity characteristics for EC and SCD designs compared with the ACD design according to an embodiment of the present disclosure.

FIG. 14A through FIG. 14C are schematic cutaway views of VCSELs according to alternate embodiments of the present disclosure.

DETAILED DESCRIPTION

Figure 1:
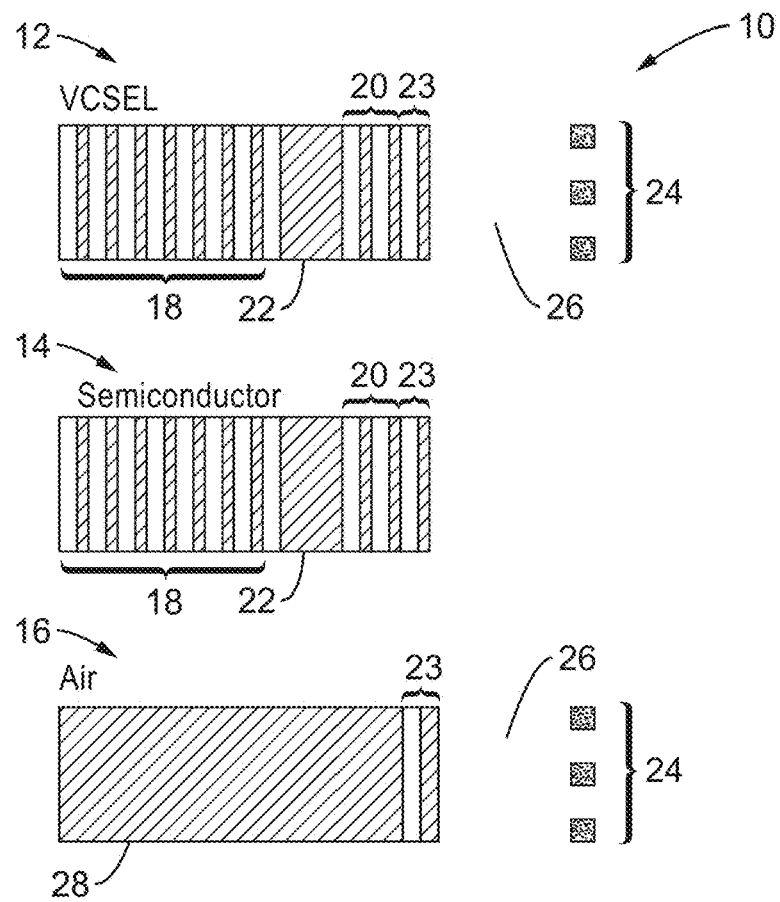
FIG. 1 is a schematic a VCSEL structure subdivided into the semiconductor cavity and the air cavity, according to an embodiment of the present disclosure.

1. Air Cavity Dominant VCSELs with Wide Wavelength Tuning

The presented technology is a widely tunable vertical-cavity surface-emitting laser (VCSEL) with an antiresonant semiconductor cavity. In one embodiment, a tunable VCSEL according to the presented technology comprises a highly reflective tuning mirror separated from a semiconductor cavity by an air gap with a tunable length. In at least one embodiment, the semiconductor cavity comprises a semiconductor-air coupling (SAC) region, an active cavity containing a gain material (i.e., a multiple quantum well structure), and a fixed highly reflective mirror supported by a substrate.

In at least one embodiment, the fixed highly reflective mirror comprises a distributed Bragg reflector (DBR). Depending on the contrast between the materials used in the DBR, this reflector comprises between 0 and 100 pairs of layers of alternating refractive index. In another embodiment, the fixed highly reflective mirror comprises a high-contrast grating (HCG). In at least one embodiment, a contact layer is incorporated into the structure beneath the active cavity to provide a low-resistance electrical path to the bottom of the active region.

In at least one embodiment, the active cavity comprises an active region disposed between at least two cladding layers. In at least one embodiment, the active region comprises a plurality of quantum wells (QWs) separated by barrier layers. In at least one embodiment, the cladding layers comprise a material with a refractive index higher than that of the materials directly above and directly below the active cavity, in which case the total thickness of the active cavity should be an integer multiple of the center wavelength inside the material. In at least one embodiment, the cladding layers comprise a material with a refractive index lower than that of the materials directly above and directly below the active cavity, in which case the total thickness of the active cavity should be an odd integer multiple of the center wavelength inside the material.

In at least one embodiment, a DBR is disposed above the active cavity. In at least one embodiment, the DBR comprises an oxidation layer to provide current confinement and a contact layer to provide a low-resistance electrical path to the top of the active region.

In at least one embodiment, the SAC region comprises a layer of material with a refractive index greater than the geometric mean of the layers directly above and below the SAC region. This layer has a thickness of one quarter of the center wavelength inside the material. The SAC region may contain any number of layers of any refractive index, so long as the reflection from the SAC region is out of phase, or more preferably $\pi$ radians out of phase, at the center wavelength.

In at least one embodiment, the tuning mirror comprises a highly reflective high-contrast grating. In at least one embodiment, the tuning mirror comprises a highly reflective distributed Bragg reflector (DBR).

In one embodiment, the tunable VCSEL comprises, from bottom to top: a substrate, a highly reflective first distributed Bragg reflector (DBR), a one-lambda active cavity containing a multiple quantum well (MQW) gain region, a second DBR containing an oxidation layer, a semiconductor-air coupling (SAC) layer, a tunable air gap, and a highly reflective high-contrast grating (HCG) suspended by a microelectromechanical system (MEMS). The emission wavelength of the VCSEL is determined by the resonant wavelength of the entire structure, which is tuned by displacing the HCG reflector.

The first DBR may comprise many pairs of quarter-lambda thick layers with alternating refractive indices. The number of DBR pairs could range from 15.5 to greater than 40 for VCSELs grown on a GaAs substrate with $Al_yGa1-yAs/AxIGa1-xAs$ as material choices. Fewer pairs can be used in a DBR incorporating a dielectric, such as $Al_xO_y$, formed by the oxidation of AlGaAs or a deposited dielectric. The second DBR may contain 0 to 4 pairs of DBR, depending on material choices. In an electrically pumped, oxide-confined VCSEL, the second DBR may contain a quarter-lambda (¼λ) layer of AlGaAs for oxidation and a quarter-lambda (¼λ) layer of GaAs for electrical contact.

FIG. 1 illustrates an example embodiment 10 in which a VCSEL structure 12 is subdivided into two cavities, a semiconductor cavity 14, and an air cavity 16. The resonance of the tunable VCSEL structure is determined by the resonance of the air cavity, the resonance of the semiconductor cavity, and the coupling between the two cavities. The VCSEL 12 is seen with first DBR 18, second DBR 20, between which is active cavity 22. Above the second DBR is seen SAC layer 23 then air gap 26 above which is a grating (HCG) 24. The semiconductor cavity 14 is shown with the DBRs 18, 20 and active cavity 22 and SAC layer 23, but without the air gap and grating. In the example embodiment, the air cavity comprises boundary condition 28 followed by SAC layer 23, above which is the tunable air gap 26, and the HCG 24. It should be noted that by way of example and not limitation, SAC region 23 comprises a combination of a λ/2 window layer and a λ/4 layer with a refractive index that the greater than the square root of the index of the cavity. It will be noted that the SAC layer is shared by the two cavities, and shown 23 in schematic 14 and 32 in schematic 16, because it governs the coupling between the two. In regards to the boundary condition 28, it should be noted that when calculating the air cavity resonance, the layer just below the SAC region (28) is used as a boundary condition and is effectively extended to infinite thickness.

This division is shown in the figure depicting that the VCSEL structure 12 can be subdivided into these two cavities: the semiconductor cavity 14 and the air cavity 16. The semiconductor excludes the tunable mirror, while the air cavity excludes all layers below the SAC region. The semiconductor cavity, which is fixed during fabrication, determines the tuning behavior of the tunable VCSEL.

In one embodiment, the semiconductor cavity is designed to be antiresonant at the center of the tuning range. By way of example and not limitation this antiresonant behavior can be obtained by configuring the semiconductor region containing the active region to have a round-trip phase delay which is an odd integer multiple of π at the center wavelength.

The above describes a very general description of antiresonance. This antiresonance can be achieved in several ways, including: (a) designing the thickness of the active cavity 22 to be an odd integer multiple of λ/2; (b) designing the upper mirror to have a reflection phase of π radians and the lower mirror to have a reflection phase of 0 radians; (c) designing the lower mirror to have a reflection phase of π radians and the upper mirror to have a reflection phase of 0 radians; or (d) designing the SAC region to give the upper mirror a reflection phase of π radians while the lower mirror has a reflection phase of 0 radians.

The resultant VCSEL is referred to as an air cavity dominant (ACD) design because the semiconductor cavity antiresonance at the tuning center causes the optical energy to be stored primarily in the air cavity. This design has a wide tuning range, such as 6.9%, making it an improvement upon semiconductor cavity dominant (SCD) and extended cavity (EC) designs. Furthermore, the threshold material gain of the antiresonant ACD design is not increased in comparison to the threshold material gain of EC or SCD designs because the air gap is lossless; which results in an increased tuning ratio of a threshold current, which by way of example can be as low as 0.35 mA.

Figure 2A:
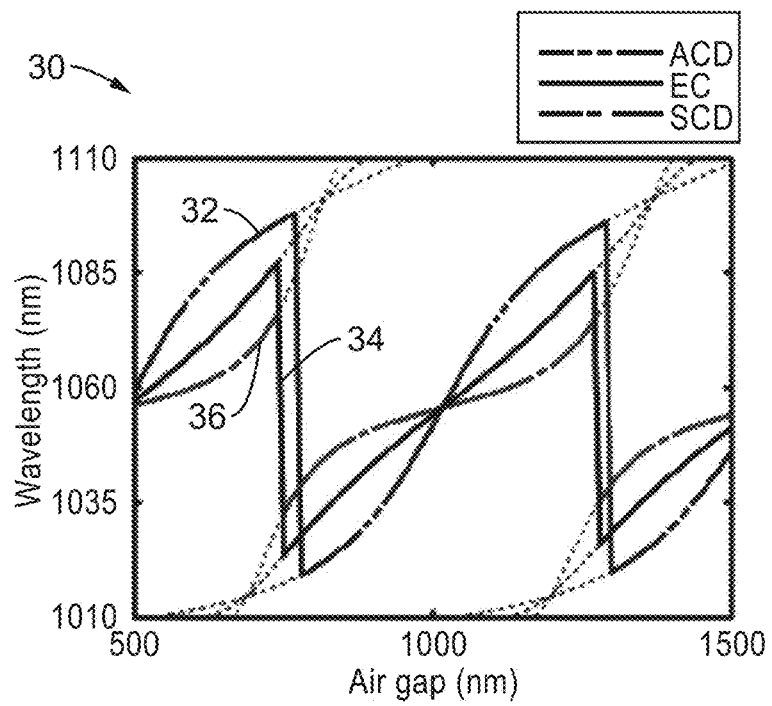
FIG. 2A and FIG. 2B are plots of tuning curves and threshold material gain for extended cavity (EC) and semiconductor cavity dominant (SCD) VCSEL devices as compared with air-cavity dominant (ACD) VCSELs according to an embodiment of the present disclosure.
Figure 2B:
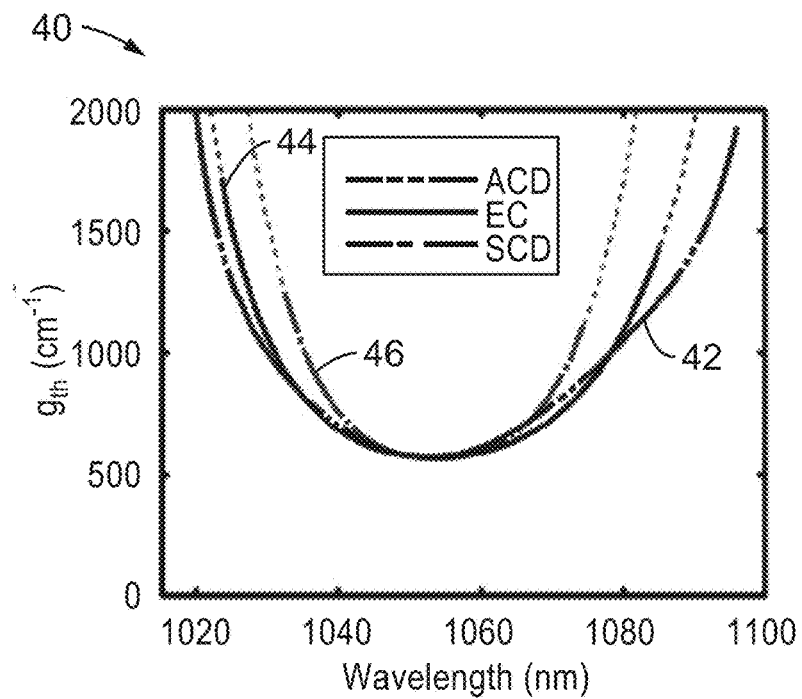

FIG. 2A and FIG. 2B illustrate comparisons 30, 40 of characteristics between the disclosed air cavity dominant (ACD) design and those of EC and SCD. FIG. 2A depicts 30 a tuning curve showing emission wavelength as a function of air gap length for ACD 32, EC 34, and SCD 36 based devices. FIG. 2B depicts 40 a threshold material gain for ACD 42, EC 44, and SCD 46 based devices. The tuning curve shows that the ACD design has the widest tuning range, which is measured as the vertical extent of the solid curves. The threshold material gain curves show that all three devices have almost identical thresholds at the center of the tuning range.

The antiresonant ACD VCSEL is extremely flexible in epitaxial design since the only requirement is a semiconductor cavity antiresonance at the center wavelength, as discussed below.

Figure 3A:
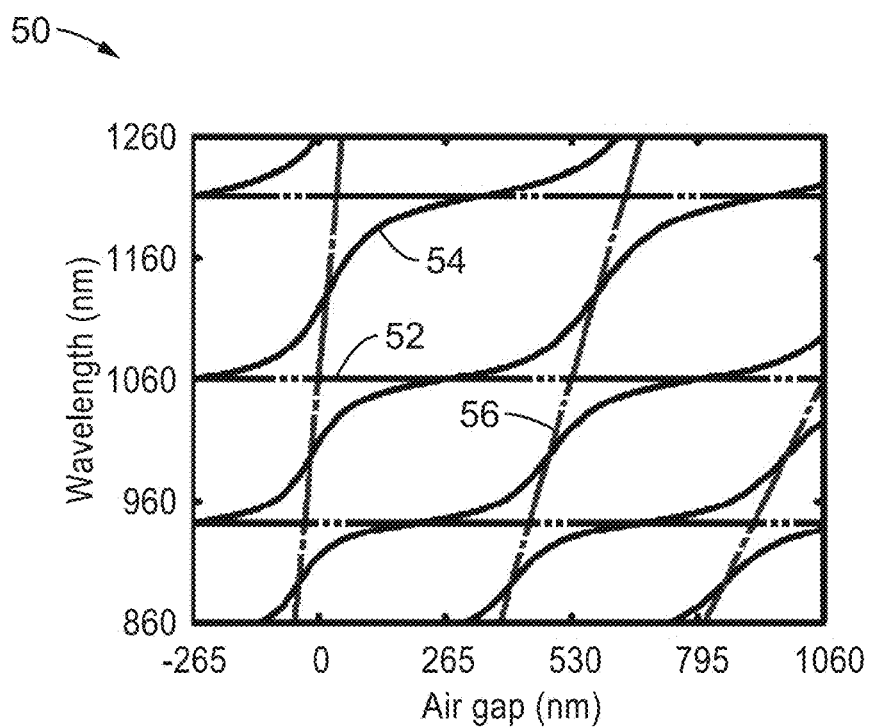
FIG. 3A and FIG. 3B are plots of tuning curves characteristics of a semiconductor cavity dominant (SCD) device compared with an air cavity dominant (ACD) device according to an embodiment of the present disclosure.
Figure 3B:
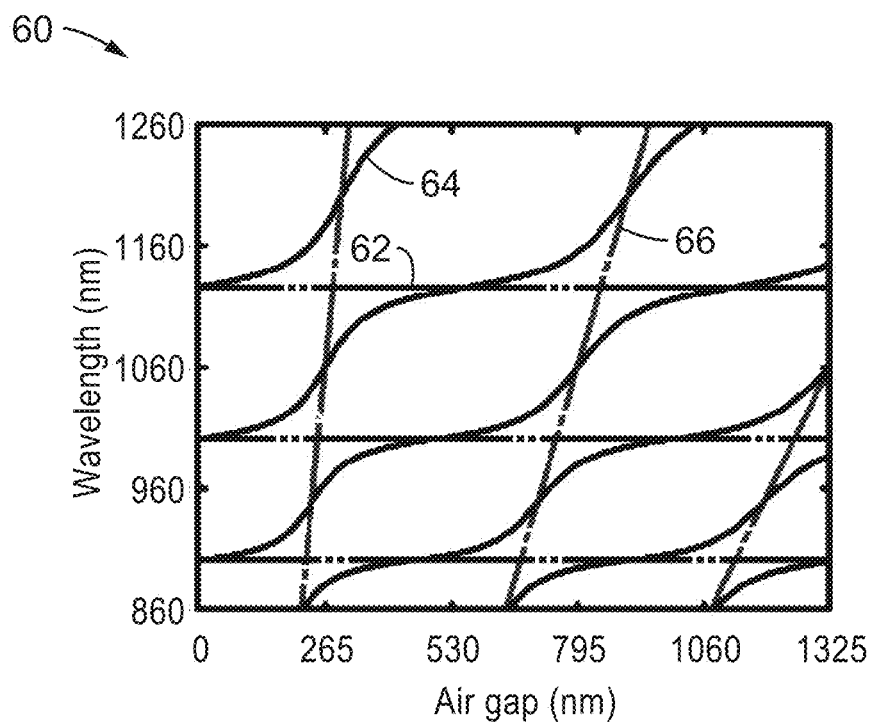

FIG. 3A and FIG. 3B illustrate examples 50, 60 comparing tuning curves between SCD based VCSEL in FIG. 3A, and an ACD based VCSEL device in FIG. 3B. Curves 54, 64 show the emission wavelengths of the VCSEL as a function of air gap length. The horizontal lines 52, 62 indicate the resonant wavelengths of the semiconductor cavity. The sloped lines 56, 66 indicate the resonant wavelengths of the air cavity. These curves were obtained, by way of example and not limitation, for a VCSEL device designed with a tuning center at 1060 nm. In these figures one can see that FIG. 3A shows a semiconductor cavity resonance at the tuning center of this SCD based design, while FIG. 3B shows semiconductor cavity resonances shifted away from the tuning center for the ACD based design. This change in semiconductor resonance wavelength marks the difference between SCD and ACD devices.

In our previous disclosure, as described in Section 3 below entitled "Air-Cavity Dominant Vertical Cavity Surface Emitting Lasers", we described a SAC region with strict requirements on refractive index and layer thickness. In contrast, the SAC region for an antiresonant ACD VCSEL can contain any number of layers with any refractive index, so long as the reflection from the SAC region into the active cavity is out of phase with the incident wave.

In one embodiment this out of phase condition can be realized practically by following a simple design rule: the SAC region should contain a high-index region with an optical path length that is an odd multiple of λ/4. For purposes of this disclosure, "high" refractive index refers to a refractive index that is higher than the square root of the refractive index of the active cavity, i.e., higher than the ideal refractive index for an anti-reflection coating. Similarly, "low" refractive index refers to a refractive index that is lower than the square root of the refractive index of the active cavity. Typically, "low" refractive indices correspond to dielectrics such as gases, oxides, or polymers, while "high" refractive indices correspond to semiconductors.

Figure 4:
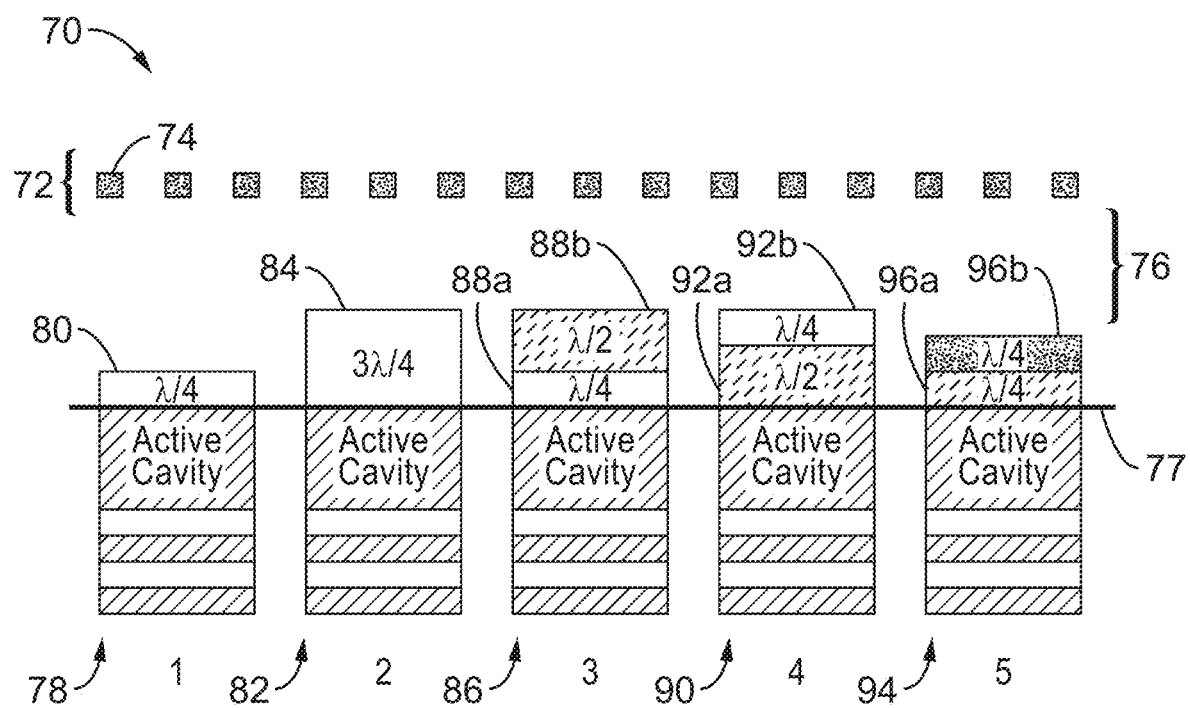
FIG. 4 are schematics of example optical structures for an antiresonant air cavity dominant (ACD) device according to an embodiment of the present disclosure.

FIG. 4 illustrates 70 by way of example and not limitation, a number of sample embodiments of this design rule. Each example is shown in relation to an HCG 72 having elements 74 over an air gap 76. All layers above the active cavity are considered to be a part of the SAC region, with line 77 marking the interface at which the reflection phase must be equal to an odd integer multiple of π at the center wavelength.

In embodiment 78 a ¼ wavelength (¼ λ) (λ/4) thick layer 80 of high index material covers the active area, while in embodiment 82 a ¾ wavelength (¾ λ) (3λ/4) thick layer 84 of high index material covers the active area. Embodiments 86 and 90 show using a ¼ wavelength (¼ λ) (λ/4) thick layer 88a, 92b of high index material combined with a ½ wavelength (½λ) (λ/2) thick layer 88b, 92a of another high index material, where the two layers have different refractive index. Then in embodiment 94 is shown the use of a ¼ wavelength (¼ λ) (λ/4) thick layer 96a of high index material over which is a ¼ wavelength (¼ λ) (λ/4) thick layer 96b of low index material. Additionally, any of the above embodiments can be configured with a low-index layer on top. One of ordinary skill in the art will also appreciate that these examples can be varied in a number of ways to supply this antiresonance of the present disclosure.

As can be seen, a tunable VCSEL according to this disclosure has several design characteristics which include, but are not limited to, the following. (1) The free spectral range and tuning slope of a tunable vertical-cavity surface-emitting laser are both increased in an air-cavity dominant design, which is realized by designing a semiconductor cavity which is antiresonant at the center of the tuning range. The semiconductor cavity is defined as the entire tunable VCSEL structure without the top movable reflector and air-gap. (2) The semiconductor cavity needs to have a round-trip phase that is an odd integer multiple of π at the tuning center, constituting an antiresonance. This can be achieved through the design of the semiconductor-air coupling (SAC) region. In typical designs, the phase accumulated by the light when passing through the active cavity and reflecting from the bottom mirror is an even integer multiple of π. In this case, the phase of the reflection by the SAC region into the active cavity must be an odd integer of π. (3) The SAC region may comprise multiple layers. As long as the overall phase of the reflection into the active cavity is π, the refractive index and thickness of the individual layers do not matter significantly. In the simplest embodiment, the SAC region may comprise a single λ/4 layer with refractive index greater than the square root of the refractive index of the active cavity. In another embodiment, the SAC region may comprise a λ/4 layer as described above with a λ/2 layer of arbitrary index on top.

2. Air Cavity Dominant VCSELs with a Wide Wavelength Sweep

2.1. Introduction

The following describes a novel design of electrically-pumped tunable vertical-cavity surface-emitting laser with a wide wavelength sweep range, which performs room-temperature, continuous wave lasing across a range of 68.38 nm centered at 1056.7 nm with a 550 kHz sweep rate, corresponding to a record high 6.5% dynamic wavelength tuning ratio ($\Delta\lambda/\lambda C$). The wavelength tuning is achieved by varying the length of the air gap between a high-contrast-grating mirror and a semiconductor epitaxial structure through using a voltage-actuated micro-electro-mechanical system, or similar electrical-to-mechanical conversion element. The large tuning ratio arises from the novel engineering of the coupling between the air and semiconductor sub-cavities. Both the free spectral range and tuning slope ($\Delta\lambda r/\Delta d$) are increased by positioning a semiconductor antiresonance at the tuning center. The large tuning range and tuning efficiency are confirmed by the results of our testing. These novel findings may lead to significant breakthroughs in tunable VCSELs, which are promising components in swept-source optical coherence tomography, light ranging, detection, and numerous additional applications.

Wavelength-swept lasers are important components in modern optical communications, light detection and ranging (LIDAR), optical coherence tomography (OCT), and high-resolution laser spectroscopy. Very important performance criteria are wavelength tuning ratio ($\Delta\lambda/\lambda C$) and sweep speed. Vertical-cavity surface-emitting lasers (VCSELs) with tuning capability have exhibited many desirable attributes including wafer-scale fabrication and testing, continuous and wide tuning, smaller footprint, and lower power consumption. Using a microelectromechanical system (MEMS), one can actuate the optical cavity length and continuously tune the lasing wavelength. Since the first MEMS-tunable VCSEL reported in 1995, many advances have been reported for center wavelengths ($\lambda C$) at 850 nm, 980 nm, 1060 nm, 1310 nm, and 1550 nm. Conventional MEMS-tunable VCSELs are designed with a high optical intensity concentrated in the semiconductor portion. This configuration is referred to as a semiconductor-cavity dominant (SCD) design. The tuning ratio of an SCD design is limited to a maximum of approximately 3.5% by the relatively small free spectral range (FSR).

To increase the tuning range, researchers have designed VCSELs with a $\lambda C/4$ thick anti-reflection (AR) layer with $n_{AR}=\sqrt{n_s}$ where $n_s$ is the index of the topmost semiconductor layer. This configuration was referred to as an extended-cavity (EC) design. In this case, the semiconductor and air cavities are perfectly matched. They resonate as one cavity, as if the original semiconductor cavity "extends" into the air region. Previously, a very large static tuning range of 102 nm centered at 1550 nm (tuning ratio $\Delta\lambda/\Delta C$ equals 6.6%) was reported for electrically-pumped EC VCSEL using electro-thermal tuning. Limited by the thermal time constant, the tuning speed is shown to be relatively slow at 215 Hz with a smaller dynamic sweep range of 87 nm ($\Delta\lambda/\lambda C=5.6\%$).

A third configuration is called the air-cavity dominant (ACD) design, in which the semiconductor portion has an anti-resonance at the center wavelength, forcing the optical field to be confined more significantly in the air cavity at the tuning center wavelength. This design has led to a record wavelength tuning ratio $\Delta\lambda/\lambda C$ of 6.9% for a VCSEL centered at 1060 nm, while it also allows more flexible choices in materials and thicknesses.

The following discusses the continuous sweep of this novel device with a wide dynamic tuning ratio of 6.5% at a fast speed of 550 kHz. Such broad tuning and fast speed are attributed to the ultra-broadband and ultra-lightweight high-contrast metastructures (HCMs) or high-contrast gratings (HCGs) being utilized. In addition, a simple physical model and detailed analysis is provided to explain the coupling effect of the air and semiconductor cavities, which ultimately determines the tuning range.

2.2 Underlying Physics

Figure 5A:
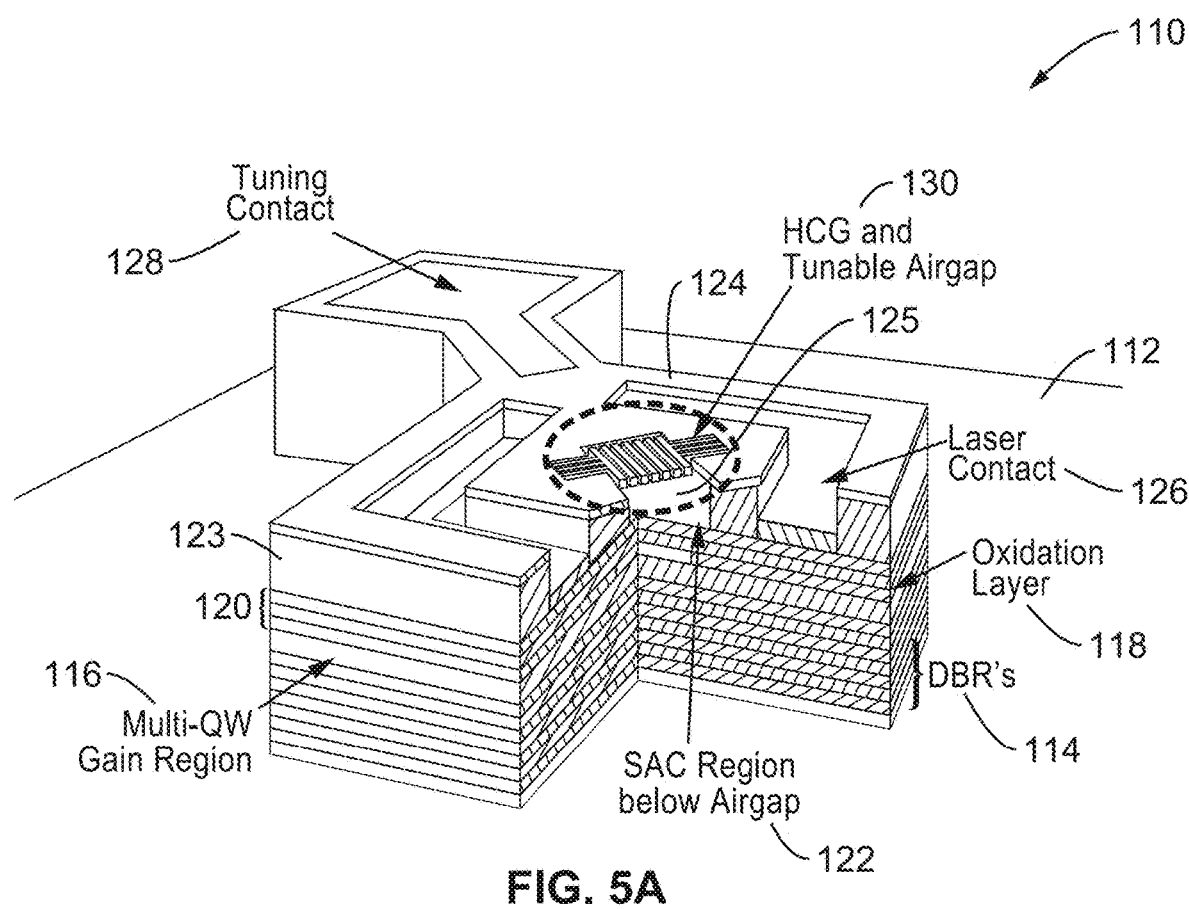
FIG. 5A and FIG. 5B are schematic and scanning electron microscopy (SEM) image an ACD MEMS-HCG tunable VCSEL with engineered SAC region according to an embodiment of the present disclosure.
Figure 5B:
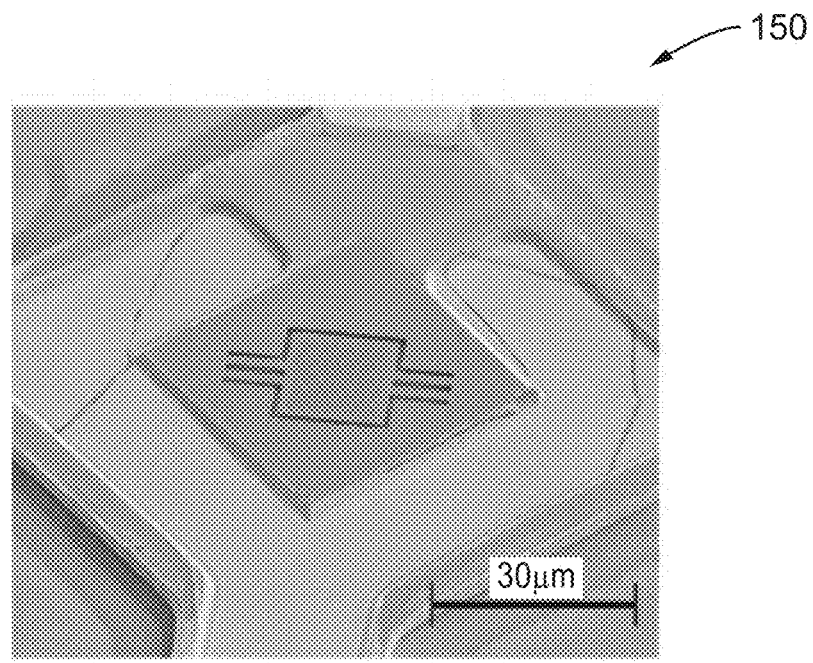

FIG. 5A and FIG. 5B illustrate a schematic view 110 and scanning electron microscopy (SEM) image 150 of the disclosed 1060-nm ACD MEMS-HCG tunable VCSEL with engineered SAC region.

In FIG. 5A the device is seen having a semiconductor portion, a top HCG mirror, and an air gap in between forming an air cavity. The VCSEL is shown on a substrate 112 with a first set of DBR layers 114 followed by a multiple quantum well (multi-QW) gain region 116, oxidation layer 118, a second set of DBR layers 120 (thinner than the first set), a semiconductor-air coupling (SAC) region 122 which is below the airgap 125 under HCG 130. Above the SAC region on the perimeter is a sacrificial region 123 which is etched away to form the airgap in the region below the HCG, upon which is an HCG layer 124, with an inset laser contact 126 shown and a tuning contact 128.

Thus in this example embodiment, the semiconductor portion includes a semiconductor-air coupling (SAC) region, two pairs of p-DBRs (Al0.12Ga0.88As high-index layer first, followed by Al0.9Ga0.1As low-index layer, Al0.12Ga0.88As high-index layer, and Al0.98Ga0.02As layer for oxidation), a $1\lambda_C$ cavity with five quantum wells in the center, followed by an n-BDR, preferably 38.5 pairs of n-DBRs, all grown on an n-doped GaAs substrate. In essence, one can identify two longitudinally coupled cavities: one centered at the active cavity with quantum wells, and a second centered at the air gap between the HCG and the semiconductor. The SAC region dictates the difference between the three designs: SCD, EC and ACD.

FIG. 5B illustrates a scanning electron microscopy (SEM) image 150 of the disclosed 1060-nm ACD MEMS-HCG tunable VCSEL.

FIG. 6A through FIG. 6D illustrate a simple schematic 170 of two coupled cavities and comparisons 180, 190, 200 of characteristics for ACD, EC, and SCD designs.

In FIG. 6A a simplified Illustration of two coupled cavities is shown with a semiconductor-air coupling (SAC) layer in-between. The $4\lambda_C$ semiconductor cavity 172 with index $n_s$, the SAC layer 174 with index $n_{SAC}$, and the air cavity 176 having an index of 1. The reflectors are indicated by dashed lines at $r_1$, $r_2$, and $r_3$.

To explore the underlying physics of the two cavities, the entire epitaxy stack was simplified to a $4\lambda_C$ semiconductor cavity with index $n_s$, a $\lambda_0/4$ SAC layer, and an air region of variable length (index 1), shown in FIG. 6A. The semiconductor cavity was chosen to be $4\lambda_C$ to have a similar FSR to a realistic design. The structure is bounded on both sides by ideal reflectors which have Fresnel coefficients $r_1=r_3=0.999+0i$ for all wavelengths. In the following only the three refractive index values for the $\lambda_C/4$ SAC layer, $n_{SAC}=1$, $n_{AR}$, $n_s$ were considered as representing ACD, EC, and SCD cases, respectively.

FIG. 6B illustrates 180 a tuning characteristic comparison between ACD, EC, and SCD cases, showing wavelength (nm) with respect to air gap (nm). The ACD design has the widest FSR when measured around the center wavelength of 1060 nm. The resonances of the simplified coupled-cavity structure for the three cases are calculated using the transfer matrix method by finding the wavelengths with zero round-trip phase for each air cavity length, and are plotted as a function of air cavity length, as shown in FIG. 6B, for all three cases. The EC case has Fabry-Perot (FP) wavelength linearly dependent on the air cavity length since the entire structure is one cavity. However, the SCD and ACD have distinctly different curvatures.

To understand the curvatures of the ACD and SCD resonance lines, the two cavities are examined: the air cavity defined by $r_1$, $r_2$ and the semiconductor cavity defined by $r_2$ and $r_3$. The FP resonances for the semiconductor cavity, computed by removing $r_1$ from the transfer matrix simulation described above and plotted 192, 202 in FIG. 6C and FIG. 6D, are horizontal lines since they do not depend on the air cavity length. The FP resonances for the air cavity between $r_1$ and $r_2$, computed by removing $r_3$ from the simulation are plotted 194, 204, showing substantially vertical lines in FIG. 6C and FIG. 6D that are linearly proportional to the air cavity length. Coupling between the semiconductor cavity and air cavity occurs when the two families of lines intersect each other at the crossings marked with circles in both FIG. 6C and FIG. 6D. The FP resonances of the full structure follows these two families of lines but avoid the crossings as shown by the curving traces 196, 206. It should be noted that for the sake of clarity only one of each category of line (e.g., 192, 194 and 196) are depicted. Thus the circles indicate where the two families of lines cross, which resulted in anti-crossing in the curving resonance lines 196, 206 of the full structures.

In FIG. 6C the case is shown where $n_{SAC}=1$. The semiconductor cavity is in resonance at $\lambda_C$ 1060 nm and thus a line is shown at the center wavelength 1060 nm. At an air gap of $-\lambda_C/4$, directly touches the semiconductor cavity. The full structure resonance lines are coincident with the semiconductor cavity resonance lines. As the air gap increases, an avoided crossing causes the full structure resonance to follow the air cavity resonance. Eventually, the full structure resonance avoids a second crossing to switch back to following the semiconductor resonance line. Since there is a semiconductor resonance at $\lambda_0$, the full structure resonance shows a low tuning slope at the center wavelength. This is the characteristic feature of an SCD design.

In FIG. 6D is seen the case where $n_{SAC}=n_s$. Due to the $\lambda_C/4$ SAC refractive index, the FP wavelengths for the semiconductor cavity are shifted from those in the SCD case as seen in FIG. 6C. In this ACD case, the semiconductor cavity is in antiresonance at $\lambda_C$, with the nearest FP modes located instead at 1130.7 nm and 997.6 nm. Again, the full structure resonance lines begin coincident with the semiconductor lines at an air cavity length of 0. The VCSEL resonance curves avoid the crossings between semiconductor and air resonances as air cavity length increases. Since the semiconductor cavity is in antiresonance at $\lambda_C$, the full structure resonance follows the air cavity resonance, resulting in a large tuning slope. This represents the ACD case. A stronger coupling between the semiconductor and air cavities in either an ACD or SCD design pushes the black lines apart, approaching the tuning characteristic for the EC case, in which the cavities are perfectly coupled.

The mathematical origin of the semiconductor resonances lies in the phase of $r_2$. If $n_{SAC}<n_{AR}$, then the interface between the semiconductor cavity and the SAC layer dominates $r_2$. The reflection phase into the semiconductor cavity, $\angle r_2(\lambda_C)$, is zero, and the semiconductor cavity is in resonance at $\lambda_C$. For the special case in which $n_{SAC}\approx n_{AR}$, the magnitude of $r_2$ is insignificant and the VCSEL cavity resonates as a unit. If $n_{SAC}>n_{AR}$, then the interface between the air cavity and the $\lambda_C/4$ SAC layer dominates $r_2$. The reflection phase $\angle r_2(\lambda_C)=\pi$, the semiconductor cavity is in antiresonance at $\lambda_C$, and the design is ACD. Note this description is very general and applies to more complex designs, such as that depicted in FIG. 5A and FIG. 5B, which has two pairs of p-DBR between the $1\lambda_C$ cavity and the SAC, and the SAC consists of a window ($\lambda_C/2$) layer between the $\lambda_C/4n_{SAC}$ layer and air cavity.

For a typical tunable MEMS-VCSEL design, the air cavity length is chosen to be large enough to allow for a large tuning range with a maximum MEMS movement of approximately ⅓ of the air gap. The FSR is thus the limiting factor in tunable VCSEL designs. As noted above, FSR is not constant with changing air cavity length. The range-limiting FSR is the shortest wavelength difference between the modes directly above and directly below the center wavelength, as these are the modes which are able to achieve threshold. In both ACD and SCD designs, the highest FSR is located near the intersections of the VCSEL cavity modes and the semiconductor cavity modes. Since the semiconductor cavity modes are off-center in an ACD VCSEL, the FSR is highest when the VCSEL resonance is far from the center of its tuning range. In contrast, the FSR of an SCD VCSEL is decreased as the VCSEL resonance moves away from the tuning center. The difference in FSR is illustrated in FIG. 6B, which shows the VCSEL cavity modes for SCD, EC, and ACD designs. With this model, it is evident that to obtain a large tuning ratio, it is important to design an anti-resonant semiconductor cavity with minimum length and reduce the coupling between the two cavities. In other words, it is best to configure the device with the air cavity as dominate.

2.3. FDTD Simulation of Full Structure

The above simplified model is next verified by FDTD simulation of a realistic VCSEL structure without active layers.

Figure 7A:
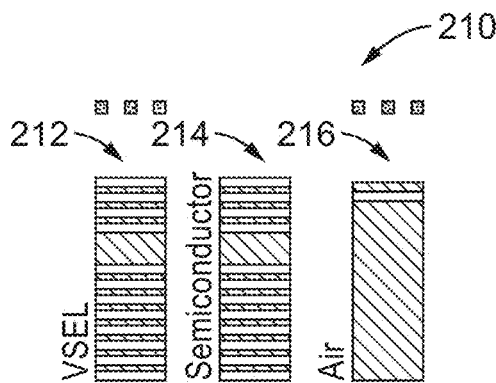
FIG. 7A through FIG. 7D are a schematic and plots of different cavity forms and plots of their characteristics according to an embodiment of the present disclosure.

FIG. 7A illustrates embodiments 210, exemplifying a structure consisting of regions of $n_{high}$=3.483 and $n_{low}$=2.988, both are greater than $n_{AR}$. The figure depicts VCSEL 212, Semiconductor cavity 214, and Air cavity 216. From top to bottom in 212, there is an HCG, a tunable air cavity, a SAC region, a 2-pair DBR, a $1\lambda_C$ high-index cavity, a multiple-pair (e.g., 38.5-pair) DBR, and a high-index substrate of infinite thickness. The SAC region contains a high-index $\lambda_C/2$ "window" layer on top of a low-index $\lambda_C/4$ layer with $n_{low}$. In this example, since there are limited choices of III-V epitaxy materials (refractive indices) for monolithic growth, the coupling effect is illustrated by changing the SAC "window" layer thickness instead, by adding or removing a $\lambda_C/4$ layer.

In this structure, $r_1$ is the reflectivity of the HCG (e.g., computed using rigorous coupled-wave analysis), $r_2$ is the reflectivity of the SAC region, and $r_3$ is the reflectivity of the 38.5-pair DBR terminating in the substrate.

Figure 7B:
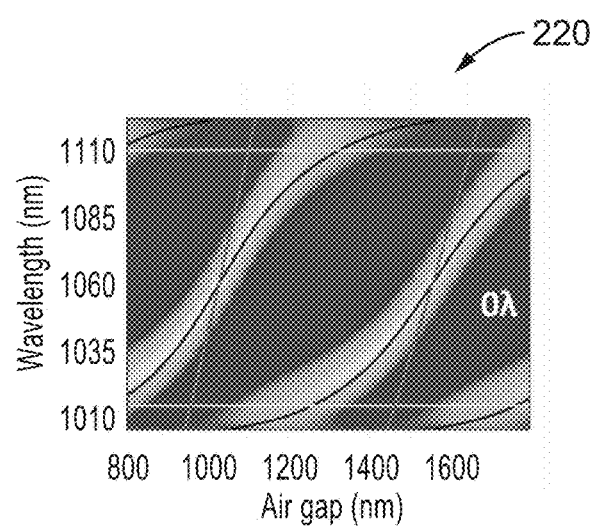
Figure 7C:
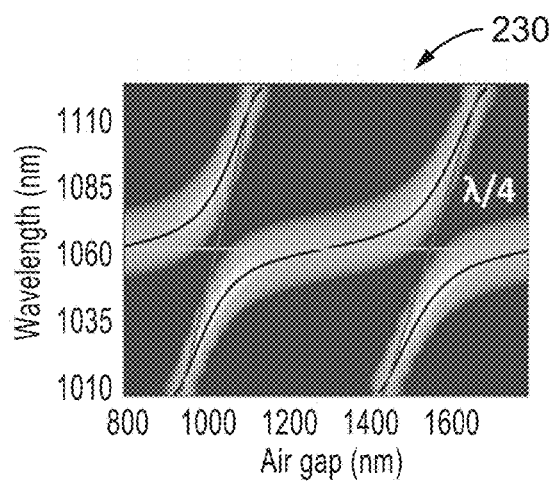
Figure 7D:
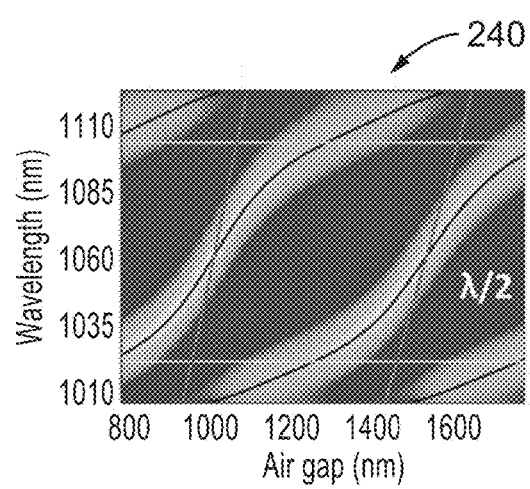

FIG. 7B through FIG. 7D illustrates results 220, 230 and 240, from an FDTD simulation showing resonance lines of the entire structure as functions of air cavity length when the "window" layer is varied from 0 to $\lambda_C/2$. The shading (original color image was color coded) indicating that the strength of the cavity resonance, lighter region represents high Q and darker region low Q. The resonance for the air cavity, semiconductor cavity and the entire structure using transfer-matrix simulations are also plotted in the same figures for comparison. Excellent agreement is obtained between the two approaches.

Since the dominant interface contributing to $r_2$ is the interface between the "window" layer and the air gap, the semiconductor cavity is significantly more sensitive to changes in "window" layer thickness than is the air cavity. As the thickness of the "window" layer increases, so does the wavelength of each semiconductor resonance. Meanwhile, the position and slope of the air cavity resonances remains almost constant. Since the tuning behavior is dominated by the semiconductor cavity resonance, any increase in the overall thickness of the semiconductor cavity corresponds to a shift in the tuning characteristic. When the thickness of the "window" layer is 0, the SAC simply consists of a low-index $\lambda_C/4$ layer (but the low index is still greater than $n_{AR}$. Hence, the semiconductor cavity is anti-resonant with two semiconductor resonances at approximately 1010 and 1110 nm, as shown in FIG. 7B, which is the ACD case. When the window layer has a thickness of $\lambda_C/4$, the semiconductor cavity is in resonance, resulting in an SCD tuning characteristic as shown in FIG. 7C. When the window layer has a thickness of $\lambda_C$p, the device is also an ACD case as shown in FIG. 7D.

2.4. Optical Confinement

The optical confinement factor is an important parameter to examine since it determines the threshold current density. The real VCSEL structure, described in a previous section and shown in FIG. 5A and FIG. 5B, is used for this study. The top $\lambda_C/4$ portion of semiconductor is InGaP in the real device (ACD), but is changed to $Al_2O_3$ in the EC design and air in the SCD device for comparison.

Figure 8A:
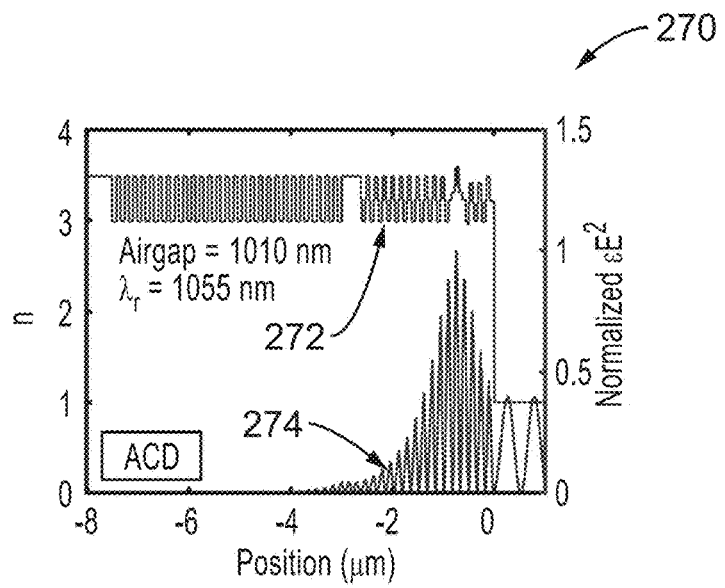
FIG. 8A through FIG. 8C are plots of longitudinal electric energy density results comparing EC and SCD designs with the ACD design according to an embodiment of the present disclosure.
Figure 8B:
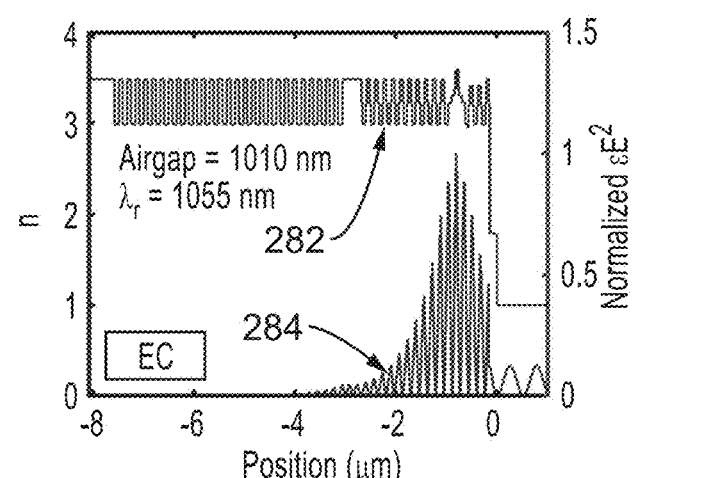
Figure 8C:
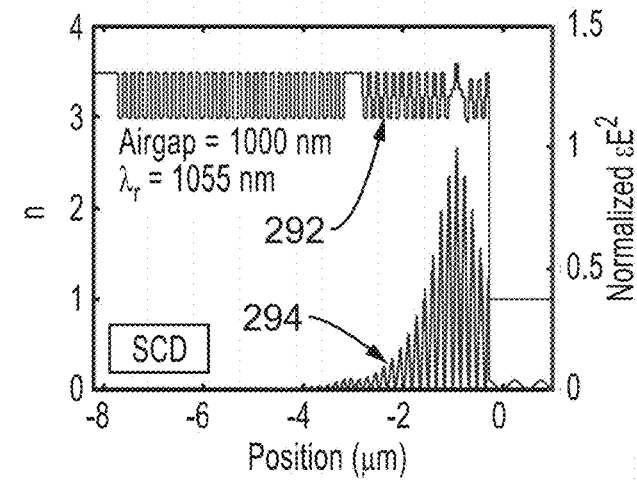

FIG. 8A through FIG. 8C illustrates example results 270, 280, 290 of longitudinal electric energy density $\varepsilon(z)|E(z)|^2$ profiles at tuning center wavelength for ACD, EC and SCD VCSELs. At the tuning center, all three cases show the largest energy density inside the MQW region, which indicates a proper field alignment. One indeed observes a relatively large energy distribution in the air cavity for ACD, in contrast to both EC and SCD. This confirms a strong coupling with the air cavity at the tuning center for the ACD case. Since ACD has more energy confined in the air sub-cavity, it should follow that the energy confinement factor for ACD is lower than EC and SCD.

To understand how the tuning impacts the laser threshold, we now calculate the effective cavity length observed from the semiconductor $$L_{eff}(\lambda_r) = -\frac{\lambda_r^2}{4\pi n_g} \frac{\partial}{\partial \lambda}(\Phi_{top}(\lambda) + \Phi_{bottom}(\lambda))|_{\lambda=\lambda_r} \tag{1}$$

where $\Phi_{top}(\lambda)$ and $\Phi_{bottom}(\lambda)$ are reflective phases for the top and bottom mirrors seen by the semiconductor cavity. In this approach, the layers beneath the central quantum well are considered as our bottom effective mirror and the layers above are considered as the top effective mirror. It should be noted that the effective length of the ACD design is the largest for all three designs at the tuning center. However, the effective length for ACD stays relatively constant across the entire tuning range, whereas that of the SCD sharply increases as wavelength deviates from the center wavelength. Indeed, at the edges of the tuning range, the effective lengths of the SCD and EC devices become larger than that of the ACD device.

FIG. 9A through FIG. 9D illustrate examples 310, 320, 330 and 340 of cavity characteristics with respect to wavelength for ACD, ED and SCD VCSEL designs. In FIG. 9A effective length is observed from the semiconductor cavity. In FIG. 9B total effective length $L_{eff}$ is plotted as a function of resonance wavelength for ACD, EC and SCD designs. In FIG. 9C threshold material gain $g_{th}$ is seen with uniform material loss $\alpha_i=20$ cm$^{-1}$ added to all semiconductor layers. In FIG. 9D confinement factor is shown calculated with $\Gamma=\alpha_m/g_{th0}$.

The threshold material gain is rigorously calculated using the transfer-matrix method for all three configurations, and plotted in FIG. 9C. This calculation includes a uniform intrinsic loss of 20 cm$^{-1}$ in every semiconductor layer. Finally, the confinement factor is calculated as depicted in FIG. 9D, by calculating mirror loss and dividing by $L_{eff}$. The ACD device has the lowest confinement factor of all three cases due to the large portion of electric energy confined in the air. Despite the significantly lower confinement factor of the ACD device, the threshold material gain at the tuning center is only increased by 1% because the air is lossless.

The effective length and confinement factor calculations provide further insight into the threshold gain and FSR of the three designs. The FSR, which is inversely proportional to $L_{eff}$, is an important parameter at the tuning edge, where neighboring F-P modes may compete for the finite gain provided by the quantum wells. As shown in FIG. 9B, the ACD design has the smallest effective length and thus the largest FSR at the tuning edge, confirming the trend noted in FIG. 6A through FIG. 6D. The reduced effective length at the tuning edge in the ACD design also results in a higher confinement factor and lower threshold gain. As a result, using this novel ACD design, the threshold gain is not compromised significantly while the tuning range is largely extended.

2.5. Experimental Results

The device shown in FIG. 5A, and was fabricated as seen in FIG. 5B using the process described in P. Qiao, K. T. Cook, K. Li and C. Chang-Hasnain, "Wavelength-Swept VCSELs," IEEE J. Sel. Top. Quantum Electron., vol. 23, p. 1700516, 2017. The GaAs sacrificial layer is removed by selective wet etching to form the 1.32 µm air gap. The SAC region of the actual device uses a design resembles the case shown in FIG. 7F, with a $\lambda_c/2$ window layer composed of an InGaP etch stop and a GaAs contact layer on top of a $\lambda_c/4$ low-index layer.

Figure 10:
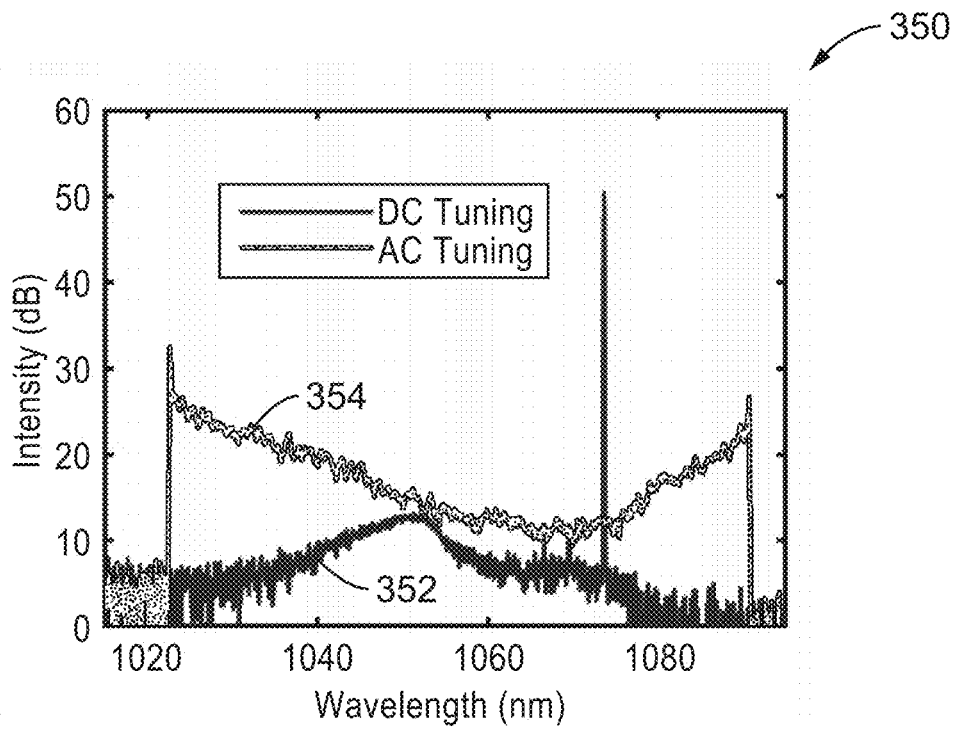
FIG. 10 is a plot of measured swept VCSEL spectra for an ACD tunable VCSEL according to an embodiment of the present disclosure.

FIG. 10 illustrates an example result 350 of measured swept VCSEL spectra for an ACD tunable VCSEL at 4.5 mA current injection under a constant DC bias 352 and with an additional 550 kHz AC 354 tuning voltage. The swept spectrum covers a range of 68.38 nm, measured at −20 dB from the tuning edge peaks.

Previous approaches have demonstrated, using a combination of thermal, current and electrostatic tuning, a single-mode continuous lasing across a 73-nm range was demonstrated. With an optimized MEMS design of the present disclosure, a continuous sweep was obtained by applying a DC tuning voltage of 31.5 V plus an AC tuning voltage of 10.0 V$_{PP}$ at the mechanical resonance frequency of 550 kHz, as shown in FIG. 10.

Resonant excitation of the mechanical structure displaces the mirror further than the equivalent DC voltage, eliminating the need for a high tuning voltage which could break down the semiconductor junction. The full dynamic tuning range is 68.38 nm, spanning from 1022.46 nm to 1090.84 nm, which is a direct proof of the extended FSR by the disclosed ACD design, and is close to the calculated tuning range of 76 nm. If the AC voltage is increased to displace the MEMS further, the next Fabry-Perot (F-P) mode will begin to lase over the same range of wavelengths. This shows that the tuning range is FSR limited and not threshold limited.

Figure 11:
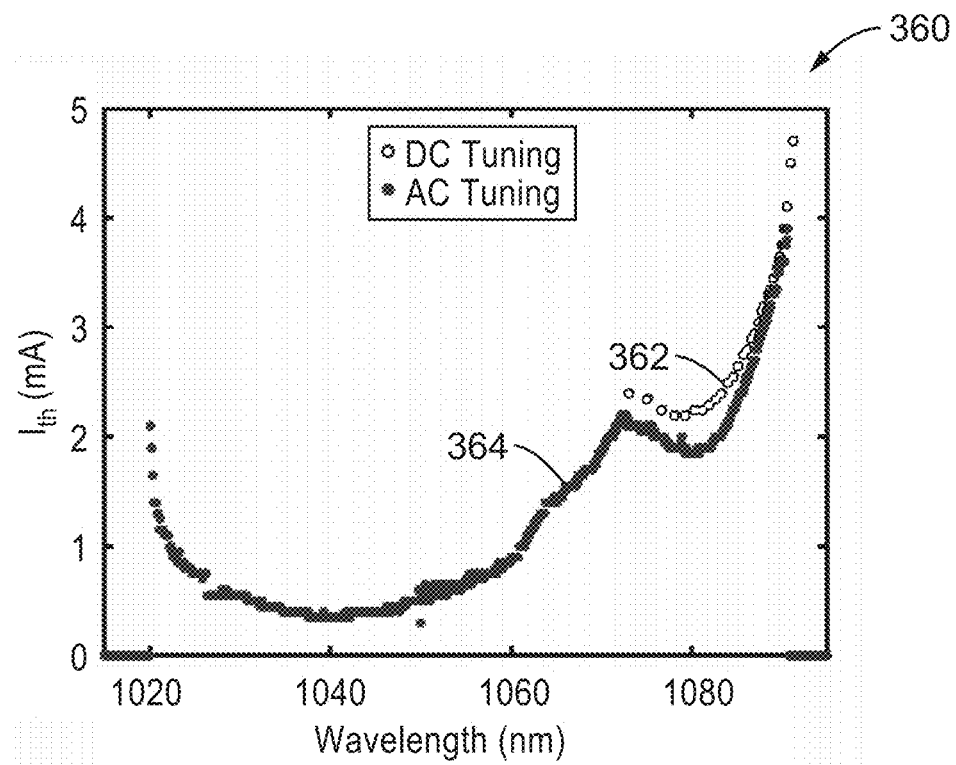
FIG. 11 is a plot of threshold current as measured with two different techniques for an ACD VCSEL design according to an embodiment of the present disclosure.

FIG. 11 illustrates an example result 360 of threshold current measured with two different techniques. The curve 362 is measured by applying a series of DC tuning biases, and measuring the threshold and wavelength at 1.1 I$_{th}$. The curve 364 is measured by applying a DC tuning bias and sweeping the position of the HCG by applying a resonant AC signal, then measuring the emission spectrum at a series of laser drive currents.

The threshold current for each wavelength is determined using the swept spectrum. The DC tuning bias, AC amplitude, and AC frequency are set such that the movement of the mirror traces one period of the tuning curve. A series of DC currents, ranging from 0.1 mA to 4 mA in steps of 0.05 mA, is applied through the laser diode. For each DC current, the emission spectrum is measured. The threshold at each wavelength is then determined by numerically differentiating the spectral intensity with respect to laser diode current and locating the abrupt step corresponding to the threshold. The results of this measurement are shown in FIG. 11. For comparison, the threshold current is also measured at a series of DC tuning biases.

The shape of the measured threshold current plotted versus wavelength in FIG. 11 deviates from the shape of the simulated threshold material gain curve in FIG. 9C in several aspects. First, the minimum threshold is blue-shifted to 1040 nm due to differences in HCG dimensions caused by variation in the lithography and etch processes. The second deviation is the peak at 1075 nm. This peak corresponds to a transition between two transverse modes. Transverse mode suppression is achieved in non-tunable oxide VCSELs by placing an oxide aperture near a longitudinal intensity node of the desired Fabry-Perot mode. In a tunable VCSEL, the position of the oxide layer with respect to the mode changes with wavelength, which can cause different transverse modes to dominate at different wavelengths. In the future, different transverse control mechanisms such as multiple oxide apertures, ion implantation, or buried heterostructure can be used to eliminate higher order transverse modes during tuning. Chirped QWs could also be used to reduce wavelength dependence in threshold current.

In summary, the present disclosure demonstrates electrically pumped VCSELs with a high tuning ratio of 6.5% using the disclosed ACD configuration. An investigation was described of the mechanism which provides such large improvement over conventional and AR-coated tunable VCSELs, finding that the creating of an anti-resonance in the semiconductor cavity is the cause for the high tuning slope and wide FSR. The wavelength tuning characteristics reside on air cavity resonance lines, resulting in small F-P mode number, small field penetration depth into effective mirrors, and thus high tuning slope. The measurements on ACD devices confirm these theories of tuning ratio enhancement with MEMS resonance tuning at a fast speed of 550 kHz.

3. Air-Cavity Dominant Vertical Cavity Surface Emitting Lasers

3.1. Introduction

There is a need for widely-tunable VCSELs than can be used as the wavelength-swept sources in OCT. One technique that could increase the tuning range of a VCSEL would be to use an engineered semiconductor-air-coupling (SAC) interface. However, a concern is that engineering the SAC region in a tunable VCSEL would cause the laser threshold to sharply increase. Therefore, researchers have not pursued that approach. Instead, researchers have applied an anti-reflection (AR) layer at the semiconductor-air interface or modified the layer orders in the top distributed Bragg reflector (DBR) to extend the tuning range. However, the AR layer has to be one quarter-lambda thick with refractive index close to the square root of the product of the semiconductor refractive index and the refractive index of air.

A layer structure is described for vertical-cavity surface-emitting lasers (VCSELs) that enable their use as widely wavelength-swept coherent light sources and multiple-wavelength VCSEL arrays.

In one embodiment, a VCSEL according to the present disclosure comprises a semiconductor portion and a top mirror with an air gap in-between. The air gap is referred to as an "air cavity" in this disclosure. The semiconductor portion comprises (listed from top to bottom) a novel semiconductor-air coupling (SAC) region, a top distributed Bragg reflector (DBR), a semiconductor cavity containing an active region, a bottom DBR, and finally a substrate. With the novel SAC region design, the emission wavelength of the VCSEL becomes strongly dependent on the air cavity thickness and/or the reflection phase of the top mirror. A much wider wavelength tuning range can thus be obtained by actively adjusting the thickness of the air gap or the reflection phase of the top mirror. A monolithic array with a large wavelength span can be obtained by changing the top reflector phase.

3.2. Embodiments of Wavelength Swept HCG VCSELs

Figure 12:
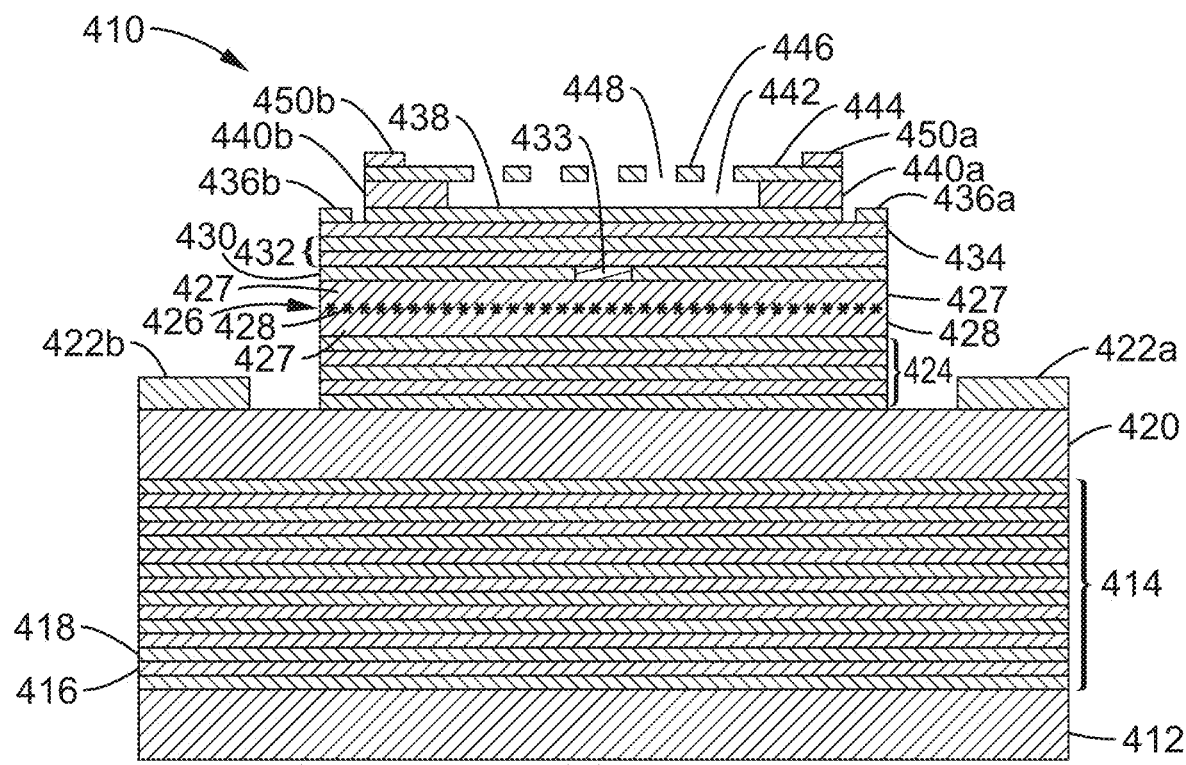
FIG. 12 is a schematic cutaway view of a VCSEL structure according to an embodiment of the present disclosure.

FIG. 12 illustrates an example embodiment 410 of a wavelength-swept high-contrast grating (HCG) vertical-cavity surface-emitting laser (VCSEL) layer structure. In this embodiment, the HCG 446 comprises a single layer of periodic subwavelength structure comprising a high-refractive index material (e.g., AlGaAs or Si) surrounded entirely by low-refractive index material (e.g., air or oxide) 442, 448. A bottom n-doped DBR (n-DBR) 414 comprising a plurality of alternating layers 416, 418, of different refractive index (e.g., preferably about 30 to 40 pairs of $Al_{0.9}Ga_{0.1}As/GaAs$) with center wavelength in this example case at 1060 nm, is shown over a substrate 412.

An n+ layer 420 is over n-DBR section 414. A first contact (n-contact) shown with sections 422a and 422b are shown over a portion of the n+ layer 420. Another reflective section 424 is shown comprising multiple layers of an n-DBR is on top of n+ layer 420 and interior to n-contact 422a, 422b.

The nominally undoped, one-lambda cavity 426 is shown with active region 427 through which are multiple quantum wells 428, such as comprising 3 to 6 InGaAs/GaAsP quantum wells (QWs). The oxidation layer 430 typically consists of high-Al content AlGaAs compounds, e.g., $Al_{0.98}Ga_{0.02}As$. Through wet thermal oxidation, the oxidation layer turns into the low-refractive-index $Al_xO_y$, compound, which is stable and robust. With the time control, the center region 433 remains unoxidized, thus providing index guiding and a current aperture. Above the cavity, there is a multiple layer p-DBR 432, for example comprising 0-2 pairs of $Al_{0.12}Ga_{0.88}As/Al_{0.9}Ga_{0.1}As$ p-doped top DBR. Over the p-DBR 432 is a p+ layer 434, which is highly conductive and suitable for deposition of metal contacts. A second contact with sections 436a, 436b is shown over p-DBR 432. A thermal oxidation layer 438, such as 30-nm $Al_{0.98}Ga_{0.02}As$, is over p-DBR 432 within the region bounded by contact 436a, 436b, is counted as part of the first low-index quarter-lambda layer. In between the HCG layer 446 and the top DBR is an undoped GaAs sacrificial layer, which was selectively removed, such as via wet etching or other removal mechanism to form air cavity 442 surrounded by remaining sacrificial layer sections 440a, 440b.

The HCG layer 446 is fabricated as part of a micro-electro-mechanical structure (MEMS) having first and second contacts 450a, 450b. The HCG layer is freely suspended above the remainder of the semiconductor layers, so that by applying a voltage on contacts 450a, 450b, across the MEMS structure, the air cavity thickness is changed and the VCSEL wavelength is tuned. The tuning of the air cavity thickness is not restricted to the electrostatic control of MEMS. Alternative tuning mechanisms include electro-thermal actuation and mechanical resonant tuning.

This disclosure focuses on discussing the layers above the semiconductor cavity to show that a tunable VCSEL structure can be seen as having two coupled cavities that are optically coupled in the longitudinal direction: a semiconductor cavity with active region and an air cavity. The conventional design had the semiconductor cavity being the dominant one in determining the Fabry-Perot mode, which is the lasing wavelength. This disclosure shows how the semiconductor-air coupling region can be designed such that the air cavity dominates and determines the Fabry-Perot mode; whereby the continuous tuning range can be greatly increased.

In a first embodiment, a conventional semiconductor-cavity-dominant (SCD) form of structure is used. Here, a high reflection is provided at the semiconductor-air interface, which suppresses the field penetration from semiconductor into air. This design resembles a conventional VCSEL in which the optical mode is confined in the semiconductor cavity.

In a second embodiment, an extended-cavity (EC) form of design is used. In this embodiment, the reflection at the semiconductor-air interface is reduced to an insignificant value compared to the SCD design with a refractive index-matched layer (i.e., AR layer) such that the entire structure resonates as one cavity. In other words, the original semiconductor cavity "extends" into the air cavity.

In a third embodiment, an entirely new design is described which we refer to as the air-cavity-dominant (ACD) design. This ACD design facilitates a larger field confinement in the air gap, and the increased field confinement causes the air gap to be the dominant cavity.

The only difference required for the three configurations is the SAC region, with engineered thickness and refractive index.

All three configurations have a hybrid top mirror, which includes an HCG, an air gap, the SAC region, and a top DBR region, located above the semiconductor cavity. The semiconductor cavity typically contains one or more QWs as the active region, as shown in FIG. 12. The QWs comprise a direct-bandgap semiconductor with the lowest bandgap energy of the entire epitaxy such that the rest of the entire epitaxy does not significantly absorb the emission from the QWs.

The semiconductor cavity typically comprises a material with a refractive index that is lower than the QW refractive index but higher than at least the low-index layer of the DBR pair. In one such embodiment, the QWs may comprise InGaAs, the semiconductor cavity may comprise GaAs or AlGaAs with low Aluminum concentration, and the DBR may comprise $Al_xGa_{1-x}As/Al_yGa_{1-y}As$ or $Al_xGa_{1-x}As/GaAs$ pairs. In this case, the semiconductor cavity thickness may be one-lambda or one-lambda plus a non-negative integer multiple of half-lambda. The placement of QWs in the semiconductor cavity and the design of the QWs would follow typical VCSEL design.

Figures 13A, 13B, 13C:
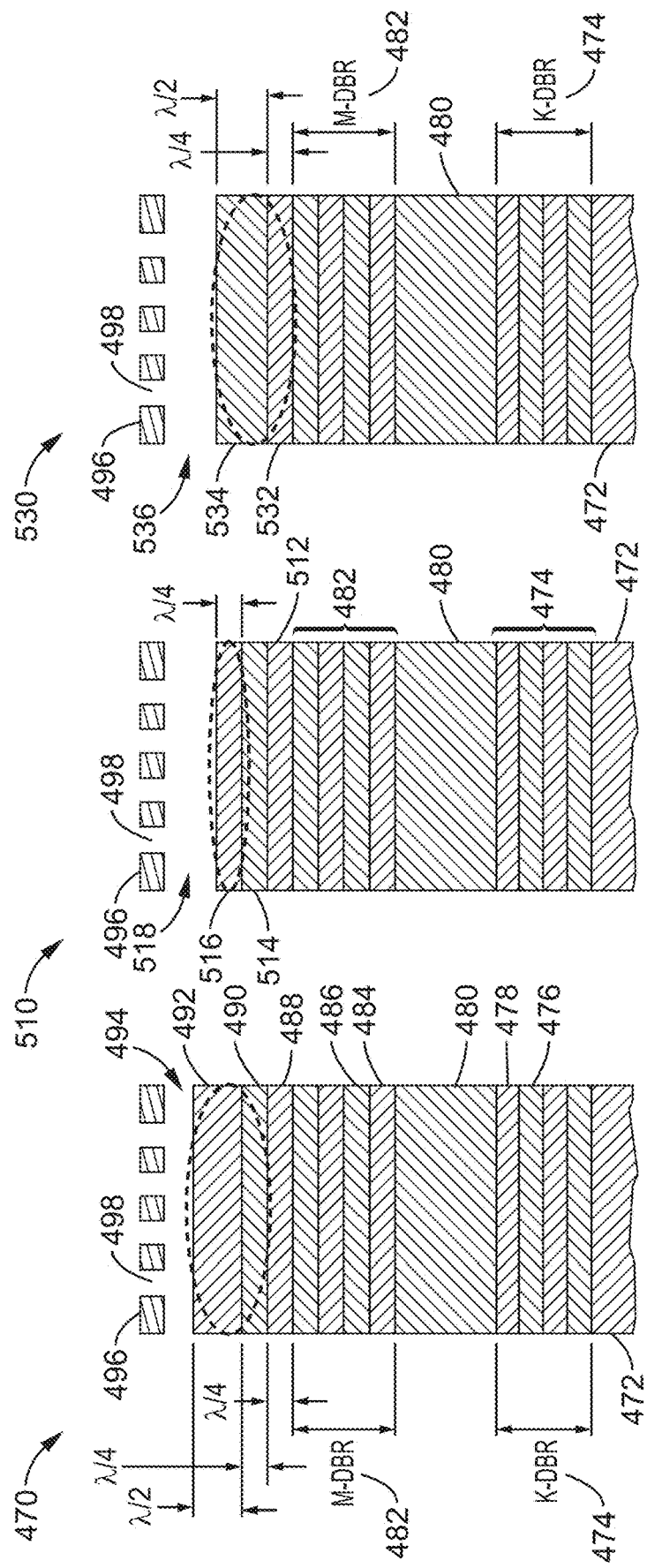
FIG. 13A through FIG. 13C are schematic cutaway views of VCSELs according to embodiments of the present disclosure.

FIG. 13A through FIG. 13C illustrate example embodiments 470, 510, 530 of the top DBR, above the laser cavity, which may comprise M pairs of alternating quarter-lambda low-refractive index layer and quarter lambda high-refractive index layer, with the quarter-lambda low-refractive index layer just above the cavity region. Throughout this disclosure, M is any non-negative integer (0, 1, 2, . . . ). It will be noted that below cavity 480 is only shown for completeness of the VCSEL structure, the bottom DBRs on substrate are typical for VCSELs.

Each of the figures show a substrate 472 over which is a K-DBR region 474 with alternating refractive index layers of material 476, 478, above which is a high refractive index material forming a one lambda cavity 480, and above which is an M-DBR 482 with alternating layers of material 484, 486.

In FIG. 13A an SCD design 470 is shown with the M pairs of top DBR followed by a quarter-lambda low-refractive index layer 488 which is referred to as "Low 1". The refractive index of the "Low 1" layer may or may not be the same as the lower refractive index used in the DBR. On top of the "Low 1" layer is the SAC region (dashed oval), which comprises a high-refractive index layer ("High 1") 490 and a window layer (WL) 492. The HCG is shown with high refractive elements 96 of the grating interspersed with low refractive elements 498 (e.g., air), over a low refractive index layer 494 (e.g., air).

The refractive index of the "High 1" layer may or may not be the same as the higher refractive index used in the DBR. The thickness of the "High 1" layer should be an odd integer multiple of quarter-lambda. The thickness of the WL can be zero or a positive integer multiple of half-lambda. Here, the refractive index of the WL may be any value, such as 1.0 to 7.5.

It should be mentioned that one alternative SCD configuration is when the WL is positioned directly on top of the semiconductor cavity without the High1/Low1 or any DBR pairs (M=0).

In FIG. 13B an EC design 510 is shown with the M-DBR region 482, above which is a quarter wavelength Low region 512, then a quarter wavelength High region 514. Then above these layers is a SAC region (dashed oval) comprising an AR layer 516 whose index is between the higher refractive index used in the DBR 496 and the refractive index of air 498, 518. The thickness of the AR layer is one quarter-lambda. To be a true AR layer, the AR refractive index should be the geometric mean of the refractive indices of the high-refractive index DBR layer and air. Here the choice of AR refractive index may deviate somewhat from the optimum value as long as the reflection at the semiconductor-air interface is noticeably suppressed.

In FIG. 13C the new ACD design is shown with the same layers as the above up through the M-DBR layers 482. Above the M-DBR is the SAC region (dashed oval) directly on top of the high-refractive index layer from top DBR. This SAC region comprises a quarter-lambda "Low 1" layer 532 and a WL layer 534, with thicknesses and choices of materials defined the same as previously in this disclosure for the SCD design. The HCG is shown with high refractive elements 96 of the grating interspersed with low refractive elements 498 (e.g., air), over a low refractive index layer 536 (e.g., air).

The most important distinction between ACD and SCD is that the SAC region includes a quarter-lambda "Low 1" layer but no "High 1" layer. It should be noted that one alternative ACD configuration is when the SAC region is positioned directly on top of the semiconductor cavity without any DBR pairs (M=0).

It should be noted that for practical design, the "High", "Low", "High 1", "Low 1", semiconductor cavity, WL, DBR and HCG may comprise multiple layers to have equivalent behavior. For example, the "High" layer in the DBR may comprise a high-refractive index layer (e.g., GaAs) and a grading layer (e.g., Al GaAs with x: 0.1->0.9), which combines to be an equivalent quarter-lambda high-refractive index layer. In another example, an SCD design, has a WL of zero thickness, and a "High 1" layer comprising an $Al_xGa_{1-x}As$ graded layer and two $Al_{0.6}Ga_{0.4}As$ layers, which combine to be one quarter-lambda. In addition, the multiple DBR pairs may comprise pairs with different material combinations. The semiconductor cavity typically comprises cavity layers, quantum wells and barriers and grading layers. In the disclosed ACD design, the WL comprises an $Al_xGa_{1-x}As$ graded layer, a GaAs layer, and an InGaP layer, which all combine to be one half-lambda thickness.

If the cavity region material is chosen to have a higher bandgap energy (lower refractive index) compared to the rest of the epitaxy, e.g., high-Al content InGaAlAs for InGaAs QWs with 1.3 µm or 1.55 µm emission, then the cavity region would be an integer multiple of half-lambda.

FIG. 14A through FIG. 14C illustrates example embodiments 550, 570, 590 of all three designs with the High and Low index materials reversed from that seen in FIG. 13A through FIG. 13C. In particular, for each of these embodiments a substrate 472 is shown, above which is a K-DBR region 474 comprising Low refractive layer, followed by High refractive layer and so forth, over which is a Low refractive index cavity 552, followed by an M+½ DBR region 554 comprising a High, Low, and High refractive index layers.

In this case, the DBR above the semiconductor cavity comprises (M+½) pairs (alternating quarter-lambda high-refractive index layer and quarter-lambda low-refractive index layer) with the quarter-lambda high-refractive index layer just above the semiconductor cavity.

The remaining layers above the top DBR for the SCD, EC, and ACD cases in FIG. 14A through FIG. 14C are the same as the corresponding SCD, EC, and ACD cases with high-index cavities shown in FIG. 13A through FIG. 13C.

In particular, the SCD design of FIG. 14A, has a "Low 1" layer 556 above the M+½ DBR, above which is a SAC region (dashed oval). The SAC region comprises a quarter wavelength High 1 layer 558, over which is a window layer (WL) 560. The HCG can be the same as in the other embodiments with high refractive elements 496 of the grating interspersed with low refractive elements 498 (e.g., air), over a low refractive index layer 562 (e.g., air).

More specifically, for the EC design of FIG. 14B, there is a "Low" layer 572 above the M+½ DBR, above which is a quarter wavelength "High" layer 574, above which is a SAC region (dashed oval). The SAC region comprises an AR layer 576. The HCG can be the same as in the other embodiments with high refractive elements 496 of the grating interspersed with low refractive elements 498 (e.g., air), over a low refractive index layer 578 (e.g., air).

More specifically, for the ACD design of FIG. 14C, there is the SAC region (dashed oval) above the M+½ DBR. The SAC region comprises a "Low1" layer 592 above which is a Window layer (WL) 594. The HCG can be the same as in the other embodiments with high refractive elements 496 of the grating interspersed with low refractive elements 98 (e.g., air), over a low refractive index layer 596 (e.g., air).

In all six cases described above, the top DBR region may comprise a small number of pairs or zero pairs. It should be noted that each of the DBR layers can be an odd integer multiple of quarter-lambda thickness. Also, the topmost layer in the hybrid top mirror may be a HCG, a 2D high contrast metastructure (HCM), a DBR comprising semiconductor or dielectric materials, or a combination of a DBR, a phase matching layer, and metal. The HCGs can be of transverse-electric (TE) type or transverse-magnetic (TM) type. The definitions and typical design parameters for TE-HCGs and TM-HCGs can be found in the literature.

It should be noted that the new ACD design is differs significantly from any air-coupled cavity previously developed in both definition and construct.

It will be appreciated that the schematics in FIG. 13A through FIG. 13C, and FIG. 14A through FIG. 14C, are mainly provided for illustration purposes of the SAC and semiconductor cavity design, and therefore the QWs, oxidation layer, tunnel junction, and so forth are not shown. For practical design based on different material systems, a proton implant layer, instead of the oxidation layer, can be incorporated into the semiconductor cavity for current confinement. Therefore, the refractive index of the cavity effectively may not be the same as either the higher or the lower refractive index in the DBR. Furthermore, buried tunnel junctions can be used next to the semiconductor cavity for the reduction of free-carrier absorption and electrical resistance in the p-type materials. In this case, the type of doping can be different for the top and bottom DBRs in FIG. 12.

3.3. Results for Wavelength Swept HCG VCSELs

Figure 15:
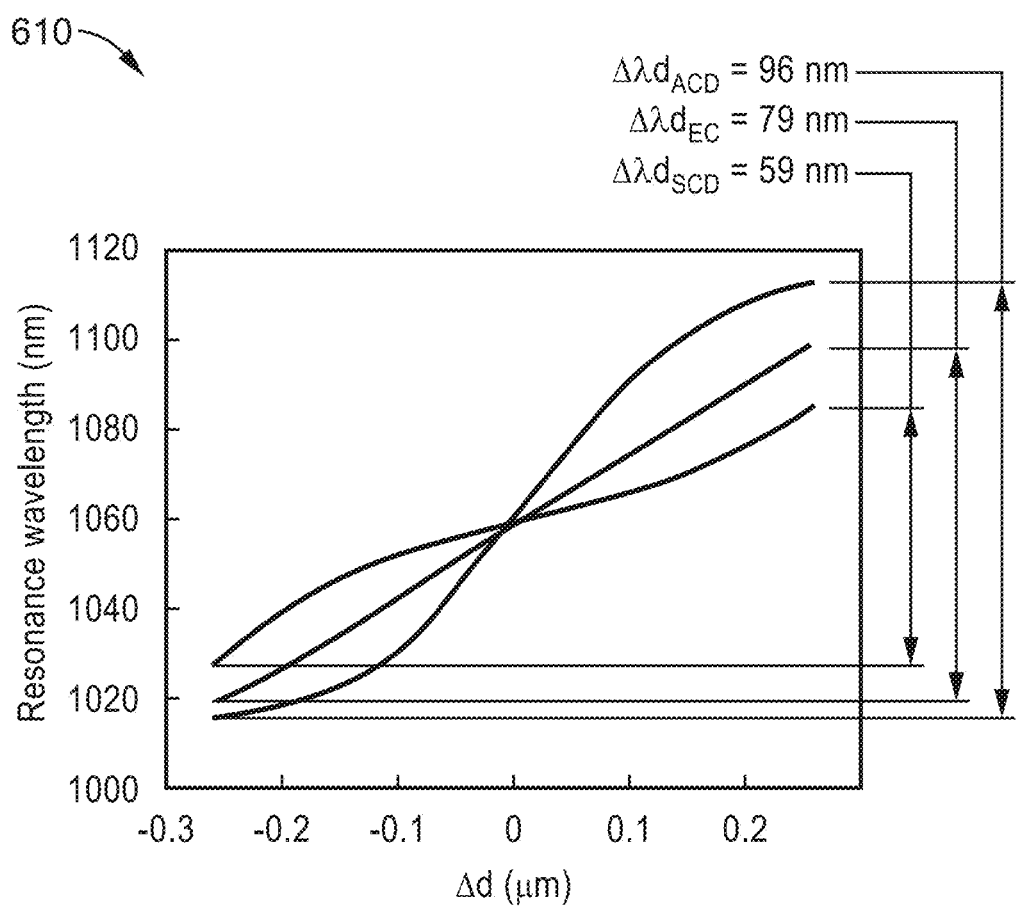
FIG. 15 is a plot of calculated tuning curves utilized according to an embodiment of the present disclosure.

FIG. 15 illustrates results 10 of calculated tuning curves from an example embodiment, specifically showing VCSEL resonance wavelength as a function of the change of the air gap thickness ($\Delta d$) for SCD, EC and ACD designs with a one-lambda cavity (as shown in FIG. 13A through FIG. 13C), using the transfer-matrix method and the complex reflection coefficient from the HCG. All three cases comprise the same full layer structures of practical wavelength-swept VCSELs centered at 1060 nm, except for being different only in their coupling regions. The "High 1" layer for SCD comprises an $Al_xGa_{1-x}As$ graded layer, a GaAs contact and an InGaP etch stop, combined to be one quarter-lambda thick. The WL for SCD is of zero thickness in this case. The EC design uses the same high-refractive index layer as SCD, followed by a one quarter-lambda $Al_2O_3$ layer. The WL of this ACD design comprises an $Al_xGa_{1-x}As$ graded layer, a GaAs contact, and an InGaP etch stop, which are same as the "High 1" layer in SCD. The only difference is the equivalent thickness being one half-lambda, instead of one quarter-lambda. Therefore, comparing SCD and ACD, the only difference is the thickness of the composite $Al_xGa_{1-x}$ As+GaAs+InGaP layer. Quite surprisingly, the tuning range increases from 59 nm (SCD) to 96 nm (ACD) by a simple change in thickness.

It should be noted that the shapes of the tuning curves for SCD, EC, and ACD are significantly different, as depicted in FIG. 15. Here, the air gap thickness is referred to as d, and the change of the air gap thickness is referred to as $\Delta d$. Hence, one can categorize the design by observing the shape of the tuning curve. For EC, the tuning curve is a straight line (i.e., the resonance wavelength is linear with $\Delta d$). For ACD, the tuning curve is an S-shape. For SCD, the tuning curve is a mirrored S-shape.

Conventionally, the VCSEL threshold material gain (proportional to threshold current) has been expressed to be proportional to the overlap integral of optical field intensity with the QWs, known as the longitudinal energy confinement factor ($\Gamma_t$), which can be written for non-dispersive or weakly-dispersive materials as:

$$\Gamma_z = \frac{\int_{L_a} n_a^2 \left| E(z) \right|^2 dz}{\int_{L} n^2(z) \left| E(z) \right|^2 dz} \quad (1)$$

where z is the direction of epitaxy (vertical direction in FIG. 12), $n_a$ and $n(z)$ are the active region and z-dependent effective indices, respectively. Here, $L_a$ signifies the integration range for calculating energies in the active region, and L is the integration range for the entire device for conventional VCSEL modeling. However, there was a misconception in the past literature that the air gap thickness was included in L for wavelength-swept VCSELs.

Figure 16A:
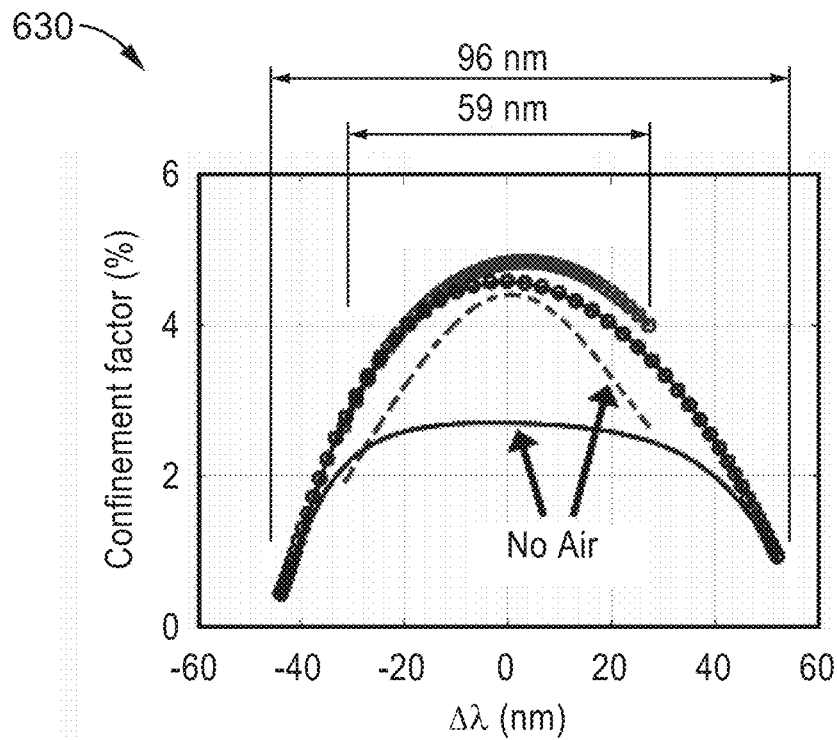
FIG. 16A and FIG. 16B are plots of confinement factor and threshold material gain determined according to an embodiment of the present disclosure.
Figure 16B:
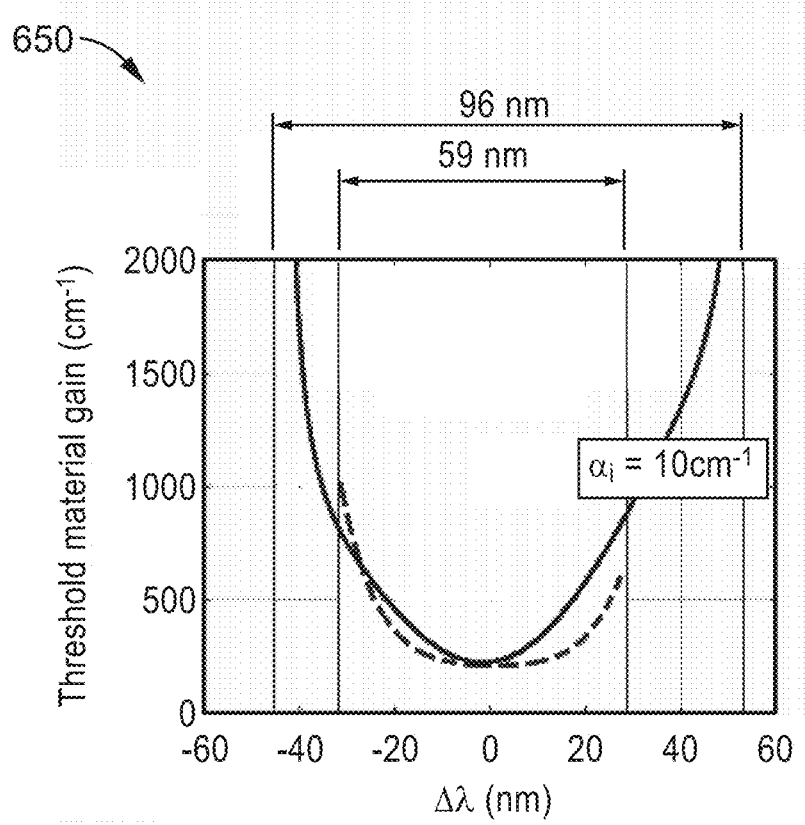

FIG. 16A and FIG. 16B depict plots of confinement factor 630, and threshold material gain 650, respectively. In FIG. 16A the curves shows the $\Gamma_z$'s for the SCD and ACD designs calculated including (solid lines) and excluding the air gaps (circles), respectively. When including the air gap, the $\Gamma_z$'s reveal a large difference between the two designs due to the different coupling strength of the semiconductor cavity with the air cavity. In this case, the energy confinement drops from 4.4% for the SCD design to about 2.7% with the ACD design. As the majority of literature considers it is correct to include the air gap in the calculation, the ACD design could be considered undesirable with a major compromise in laser thresholds. However, if excluding the air gap in the calculation, both designs have similar peak value around 5%, indicating good QW alignment without significant compromise.

One unambiguous way to calculate threshold material gain is to use the following equation, regardless of the chosen longitudinal span of devices, with round-trip gain at resonance defined as"

$$G_{RT}(g) = -\ln\left(\frac{1}{\left| r_{top}(\lambda) \right|^2 \left| r_{cavity+bottom}(\lambda g) \right|^2}\right)\bigg|_{\lambda=\lambda_r} \quad (2)$$

where g is the material gain added as the imaginary part of the active region index. The threshold material gain is found when the round-trip gain satisfies $G_{RT}$ ($g_{th}$)=0. In this example the intrinsic loss is assumed to be 10 $cm^{-1}$.

In FIG. 16B the threshold material gain curves as functions of the tuning wavelength for SCD and ACD designs are shown. The threshold gain is similar for both designs at their tuning centers, but the tuning range is wider for ACD than SCD, as indicated by the solid line in the 96 nm region and the dashed line in the 59 nm region. However, the increase of threshold away from the center wavelength is also sharper for ACD. We found that the tuning range increased from 59 nm (SCD) to 96 nm (ACD) while the difference in threshold gain at the tuning center is only different by 6% between SCD and ACD.

The tuning range of tunable MEMS-VCSELs has been primarily determined by the Fabry-Perot mode spacing, known as free spectral range (FSR). From the Fabry-Perot (FP) resonance condition, the resonance wavelength $\lambda$ is related to the air gap thickness d by $\lambda_m = 2(d+L_{eff})/m$. Here, $L_{eff}$ is the effective cavity length, and m is the FP mode number; whereby $L_{eff}$ is equal to the sum of the physical length of the semiconductor cavity and the penetration depths into the bottom and top mirrors. A larger index contrast between the DBR layers results in a shorter penetration depth at the center wavelength of the DBR band because the energy falls faster with each interface. In addition, the number of DBR pairs required for a VCSEL can be significantly reduced. For a GaAs-based VCSEL, the effective cavity length can be approximately 1 to 2 µm, resulting in a very large FSR. Small thickness variation in the DBRs or the semiconductor cavity changes the FP wavelength and, thus, the laser wavelength. Due to the large FSR, a large wavelength change can be achieved without hopping between different FP modes.

FIG. 17A through FIG. 17C, FIG. 18A through FIG. 18C, and FIG. 19A through FIG. 19C, depict results 660, 670, 680, 690, 700, 710, 720, 730 and 740 of Finite-difference time-domain (FDTD) simulations on the full tunable VCSEL structures to verify the tuning curves, where TM-polarized HCGs are used. Typical TM-HCGs centered at 1060 nm have periods ranging from 480 nm to 505 nm, and duty cycles ranging from 69% to 73%. Here, the cavity regions for all cases are one-lambda thick with indices of 3.483. Two pairs of top DBR and 38 pairs of bottom DBRs are used.

The figures compare SCD, EC, and ACD designs using the structures in FIG. 13A through FIG. 13C, with all "High" layers having an index of 3.483, and all "Low" layers having an index of 2.988. The WL thickness is zero for SCD, and half-lambda for ACD. Therefore the only difference between SCD and ACD in this case is the thickness (one quarter-lambda vs. one half-lambda) of the topmost high-index layer before air gap. Two sets of resonance lines were further identified from the asymptotic lines of the tuning curves from FIG. 17A through FIG. 17C.

Figure 17A:
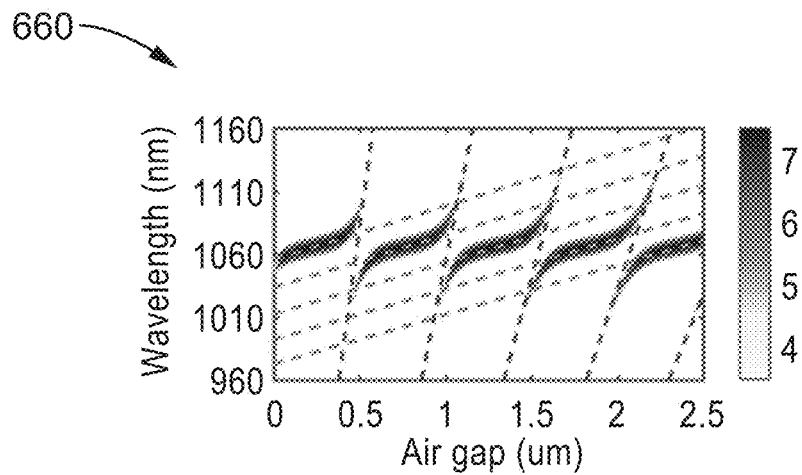
FIG. 17A through FIG. 17C are plots of tuning curves for SCD, EC and ACD VCSELs according to a first configuration of the present disclosure.

In particular, in the results 660 seen in FIG. 17A, the more vertical dashed lines for SCD correspond to $L_{eff}$=0.58 µm and m=approximately 2 to 6. The more horizontal dashed lines for SCD correspond to $L_{eff}$=22.67 µm and m=approximately 43 to 47. The more vertical dashed lines indicate air-cavity resonance with small field penetration depth into the semiconductor. The more horizontal dashed lines indicate semiconductor-cavity resonance, thus the field penetrates much deeper into the semiconductor region.

Figure 17B:
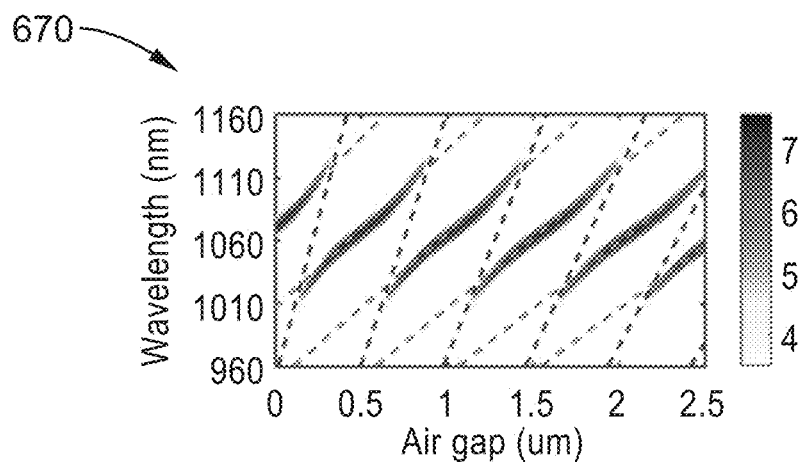

Similarly, in the results 670 seen in FIG. 17B, the more vertical dashed lines for EC correspond to $L_{eff}$=1.9 µm and m=approximately 4 to 8. The more horizontal dashed lines for EC correspond to $L_{eff}$=6.96 µm and m=approximately 13 to 18.

Figure 17C:
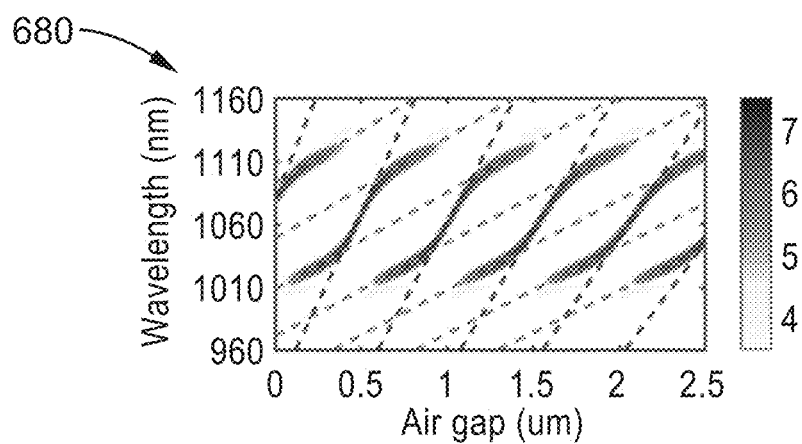

As shown in the results 680 seen in FIG. 17C, the more vertical dashed lines for ACD correspond to $L_{eff}$=3.24 µm and m=approximately 6 to 11. The more horizontal dashed lines for ACD correspond to $L_{eff}$=13.1 µm and m=approximately 24 to 30. The extracted tuning ranges for the SCD, EC, and ACD are 41 nm, 59 nm and 77 nm, respectively.

It should be noted that major parts of the tuning curves reside on the semiconductor-cavity (dark shading) resonance lines for SCD and EC designs. In contrast, the tuning curves reside on the air-cavity (light shading) resonance lines for ACD, and we observed the tuning range being largely extended.

Figure 18A:
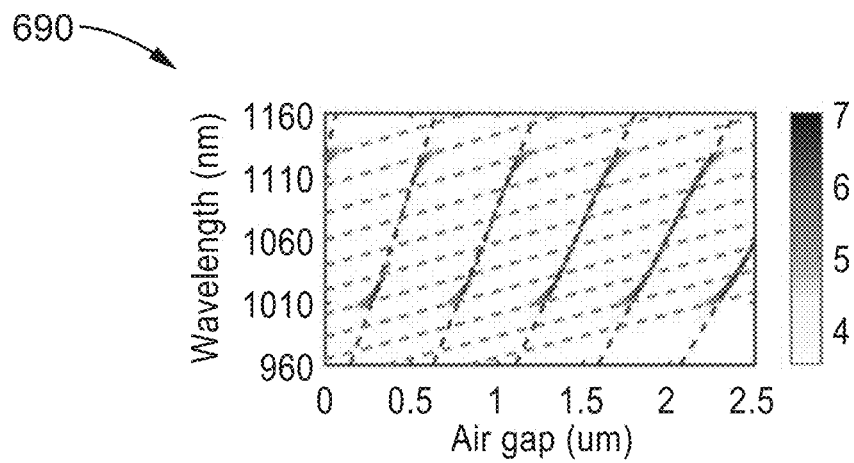
FIG. 18A through FIG. 18C are plots of tuning curves for SCD, EC and ACD VCSELs according to a second configuration of the present disclosure.
Figure 18B:
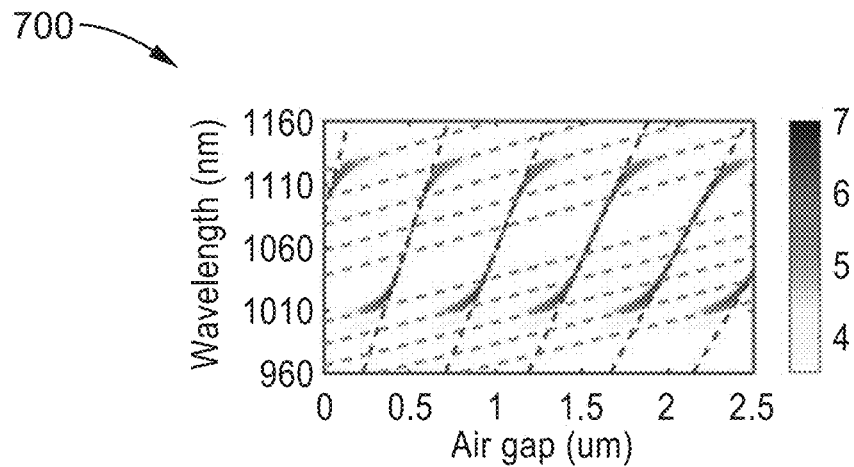
Figure 18C:
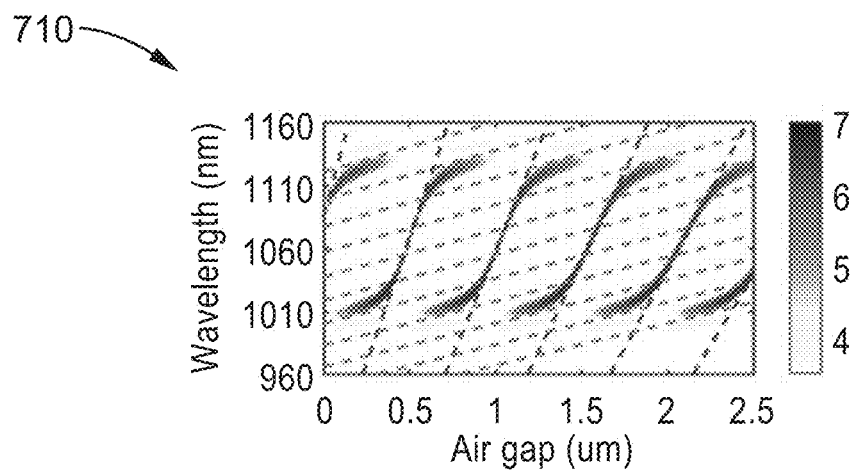

FIG. 18A through FIG. 18C depict results 690, 700, 710 from further investigations on the robustness of the novel ACD designs. The same VCSEL structure was utilized in FIG. 17A through FIG. 17C, including the HCG, except the thickness of the WL, which has an index of 3.483. In this scenario, zero pairs of top DBR were utilized with 33 pairs of bottom DBR. All "High" layers have index of 3.483, and all "Low" layers have index of 2.939. The extracted tuning ranges for WL thicknesses of zero, half-lambda, and one-lambda are 120 nm, 111 nm, and 100 nm respectively. This shows the tuning range being relatively insensitive to the WL thickness of integer multiple of half-lambda. The tuning curves remain S-shape, which indicate that WL thickness of integer multiple of half-lambda does not change the type of design. The more horizontal dashed lines correspond to $L_{eff}$=28 µm and m=approximately 50 to 60. The more vertical dashed lines correspond to $L_{eff}$=2.17 µm and m=approximately 4 to 9.

Figure 19A:
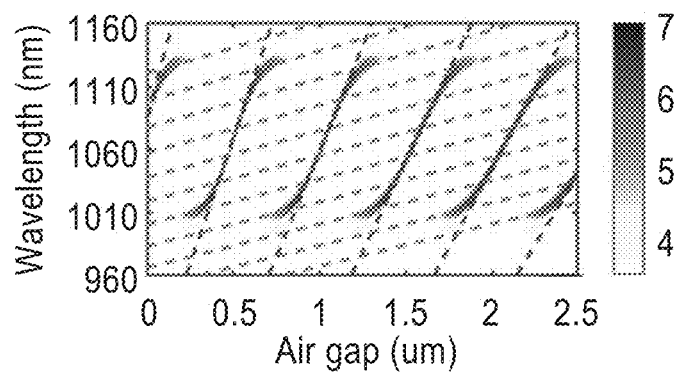
FIG. 19A through FIG. 19C are plots of tuning curves for SCD, EC and ACD VCSELs according to a third configuration of the present disclosure.
Figure 19B:
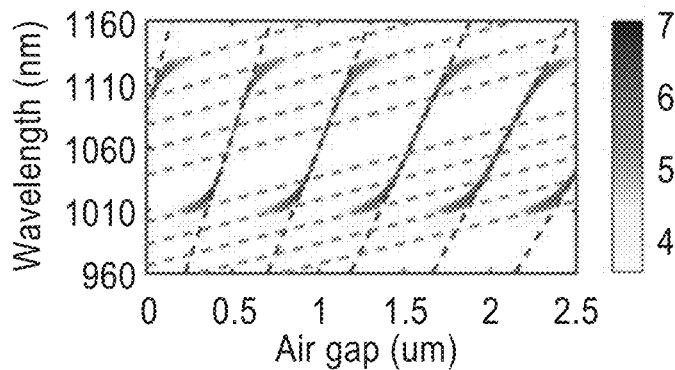
Figure 19C:
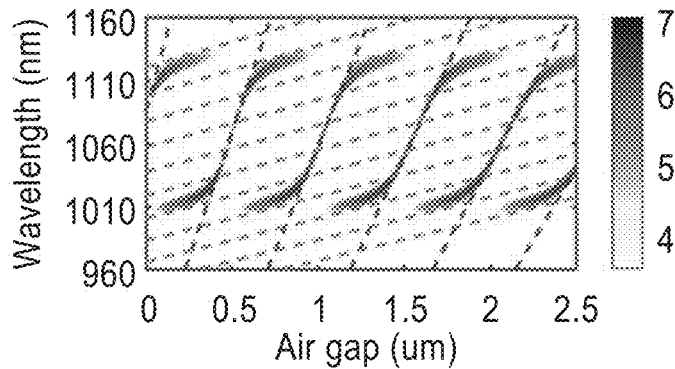

FIG. 19A through FIG. 19C depict results 720, 730, 740 from studying the effect of WL refractive index for ACD designs. The same VCSEL structure was used as in FIG. 18A through FIG. 18C. In this scenario the WL thickness is half-lambda, and the indices are 1.4, 3.483, and 7.5, respectively. The corresponding tuning ranges are 119 nm, 111 nm, and 102 nm, respectively. This shows the tuning range and the shape of the turning curve (S-shape) are insensitive to the WL refractive index. The more horizontal dashed lines and more vertical dashed lines are the same as seen in FIG. 18A through FIG. 18C.

Figure 20A:
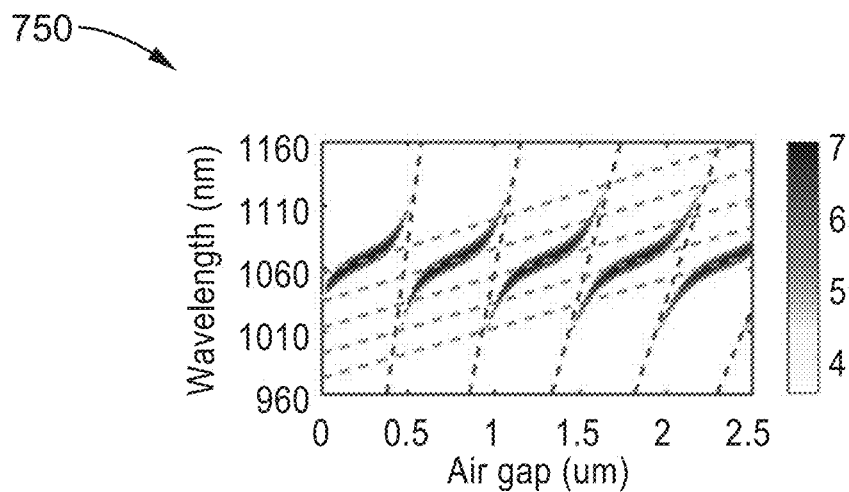
FIG. 20A through FIG. 20C are plots of tuning curves for SCD, EC and ACD VCSELs according to a fourth configuration of the present disclosure.
Figure 20B:
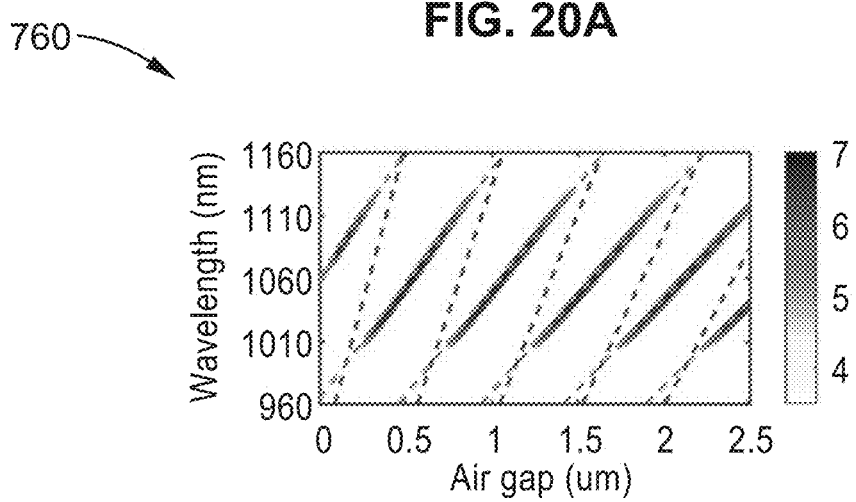
Figure 20C:
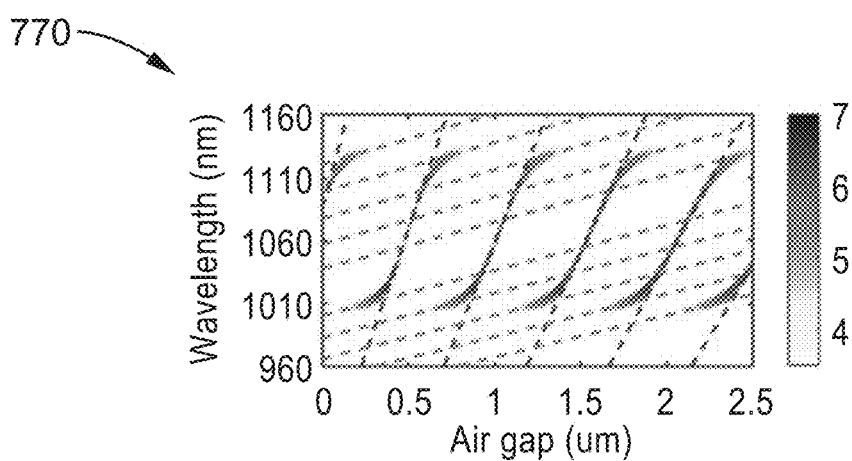

FIG. 20A through FIG. 20C depicts results for SCD 750, EC 760 and ACD 770, demonstrating FDTD simulations for the case of a low-index cavity (schematics shown in FIG. 14A through FIG. 14C). All three cases, the SCD, EC, and ACD configurations exhibit the same tuning characteristics. Here, the cavity regions for all cases are half-lambda thick with indices of 2.939. The same TM-HCGs are used as in FIG. 17A through FIG. 19C. Half pairs of top DBR and 33 pairs of bottom DBRs are used. All "High" layers have index of 3.483, and all "Low" layers have index of 2.939. The WL thickness is zero for SCD, and half-lambda for ACD. Therefore the only difference between SCD and ACD in this case is the thickness (one quarter-lambda versus one half-lambda) of the topmost high-index layer before air gap. We further identified two sets of resonance lines from the asymptotic lines of the tuning curves from FIG. 20A through FIG. 20C.

In FIG. 20A the more vertical dashed lines for SCD correspond to $L_{eff}$=0.58 µm and m=approximately 2 to 6. The more horizontal dashed lines for SCD correspond to $L_{eff}$=24.8 µm and m=approximately 47 to 51. The more vertical dashed lines indicate air-cavity resonance with small field penetration depth into the semiconductor. The more horizontal dashed lines indicate semiconductor-cavity resonance, thus the field penetrates much deeper into the semiconductor region.

Similarly, FIG. 20B shows the more vertical dashed lines for EC correspond to $L_{eff}$=1.83 µm and m=approximately 4 to 9. The more horizontal dashed lines for EC correspond to $L_{eff}$=5.3 µm and m=approximately 10 to 15.

As shown in FIG. 20C, the more vertical dashed lines for ACD correspond to $L_{eff}$=2.17 µm and m=approximately 4 to 9. The more horizontal dashed lines for ACD correspond to $L_{eff}$=28 µm and m=approximately 50 to 60. The extracted tuning ranges for the SCD, EC, and ACD are 55 nm, 87 nm and 112 nm, respectively.

Figure 21A:
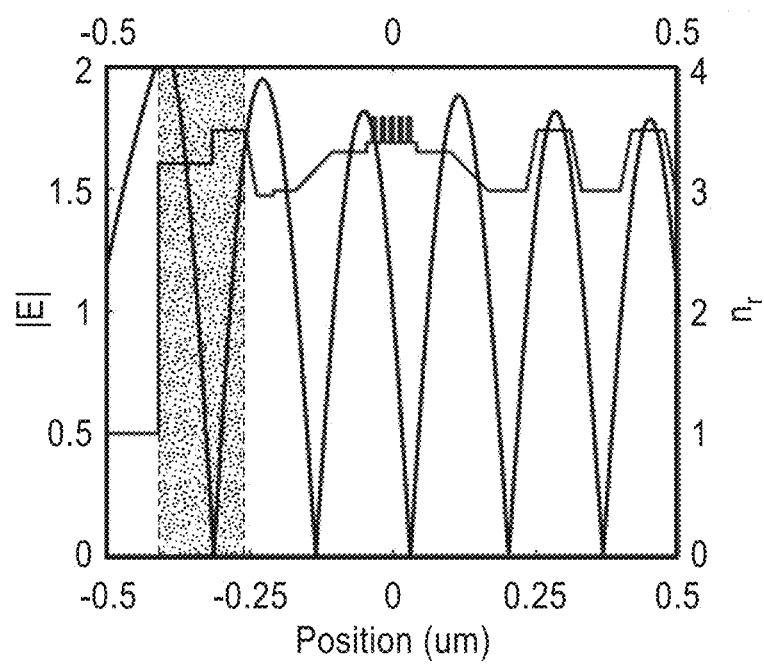
FIG. 21A through FIG. 21C are plots of field peak location shifting at corresponding resonance conditions for SCD, EC and ACD VCSELs according to embodiments of the present disclosure.
Figure 21B:
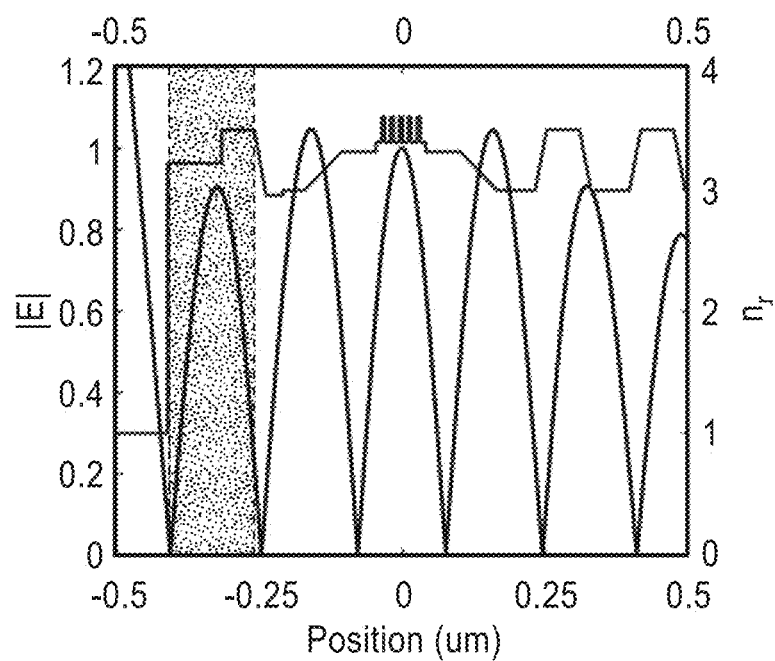
Figure 21C:
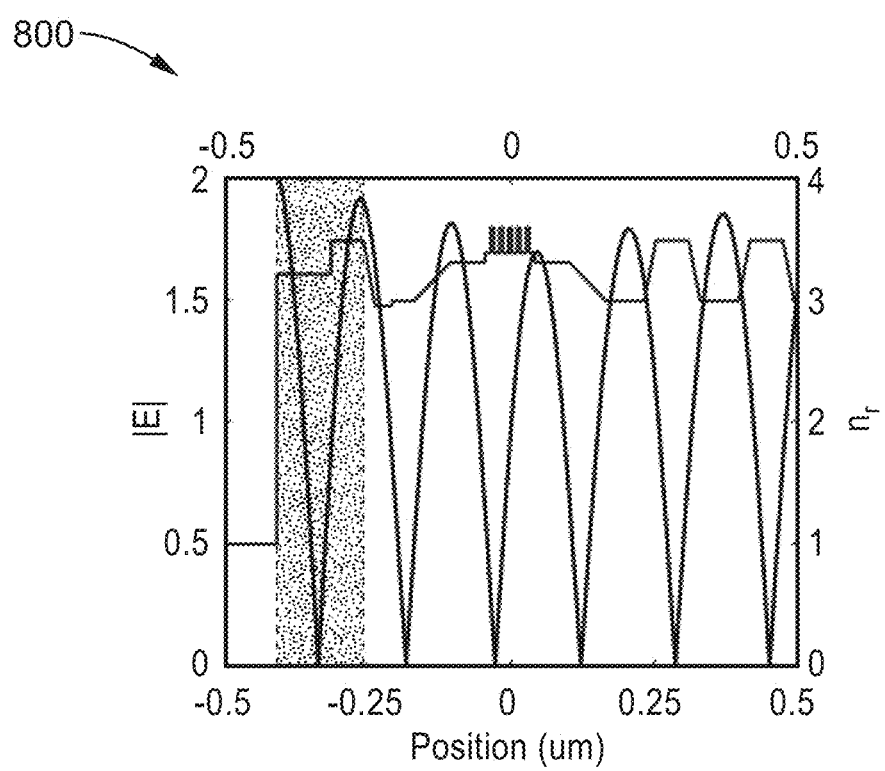

FIG. 21A through FIG. 21C depict results 780, 790, 800 of the shifting of the field peak location at corresponding resonance conditions for a given tunable VCSEL at different air gap thicknesses. The figures illustrate longitudinal field distributions in the cavity region for an ACD VCSEL with air gap thicknesses of 1280 nm (FIG. 21A), 1010 nm (FIG.

21B), and 760 nm (FIG. 21C), with resonance wavelengths being 1112 nm (FIG. 21A), 1057 nm (FIG. 21B), and 1016 nm (FIG. 21C), respectively. At the long-wavelength (short-wavelength) side of the tuning range, the field overlaps more with the QW farther from (closer to) the substrate. Knowing this, we can use different QW thickness and composition to improve the gain for the specific wavelengths. In particular, QWs may be designed with shorter wavelength (higher quantization energy) closer to the substrate and longer wavelength (lower quantization energy) farther from the substrate, to facilitate a larger overlap more with the optical field as the air gap is varied. Therefore we will use larger (smaller) thickness for the QWs which are farther away (closer to) the substrate. Alternatively we can chirp the QW composition. For example, we will use higher (lower) Indium composition in the InGaAs QW which is farther away (closer to) the substrate.

Figure 22A:
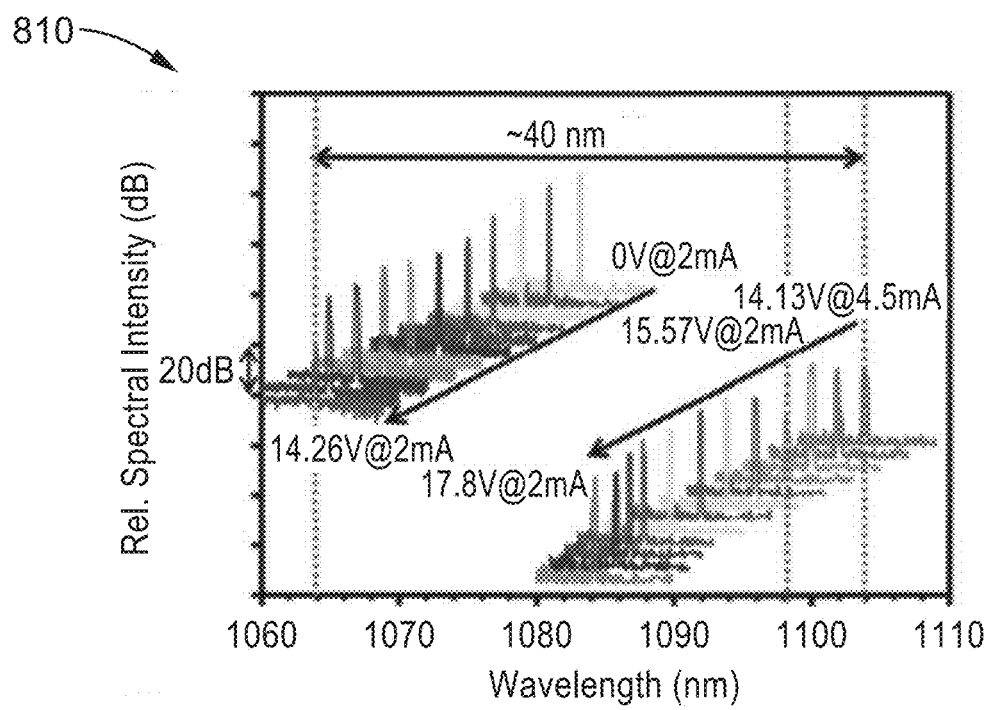
FIG. 22A and FIG. 22B are waveforms of tuning range improvements for the ACD VCSEL design according to an embodiment of the present disclosure.
Figure 22B:
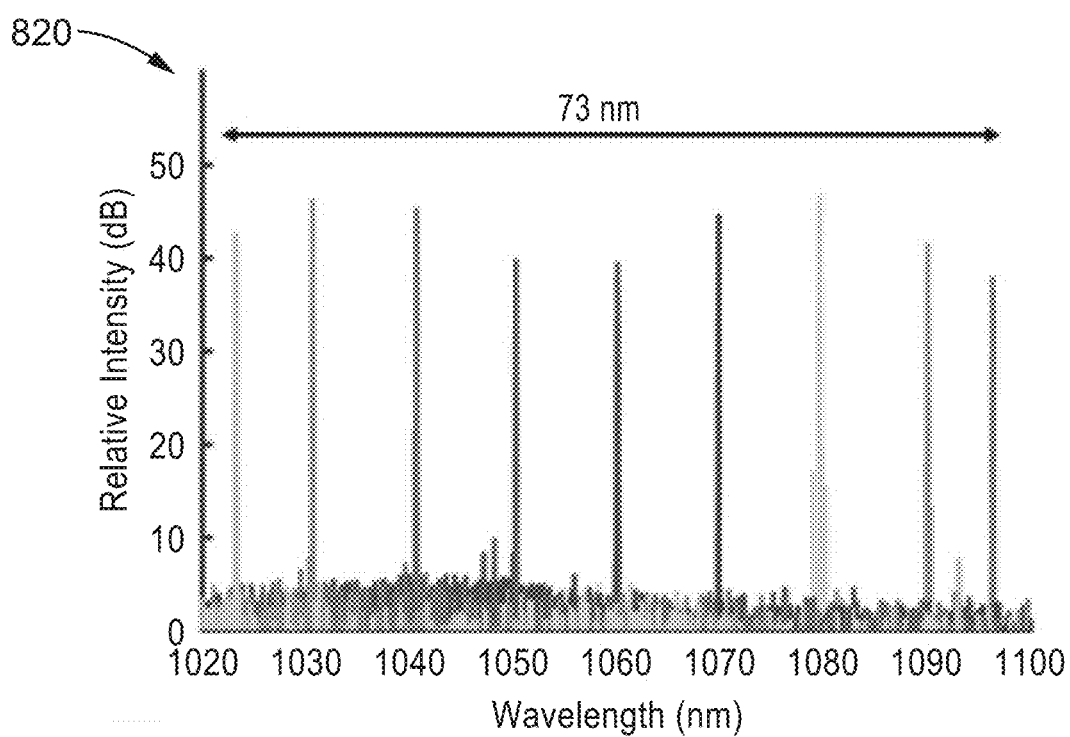
Figure 23A:
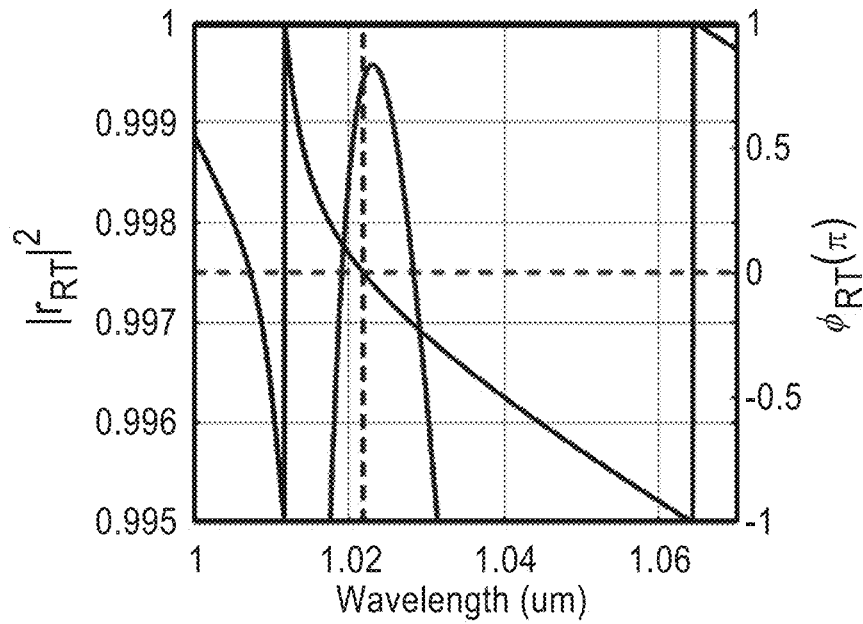
FIG. 23A through FIG. 23D are plots of changing reflection phase of the hybrid top mirror according to an embodiment of the present disclosure.
Figure 23B:
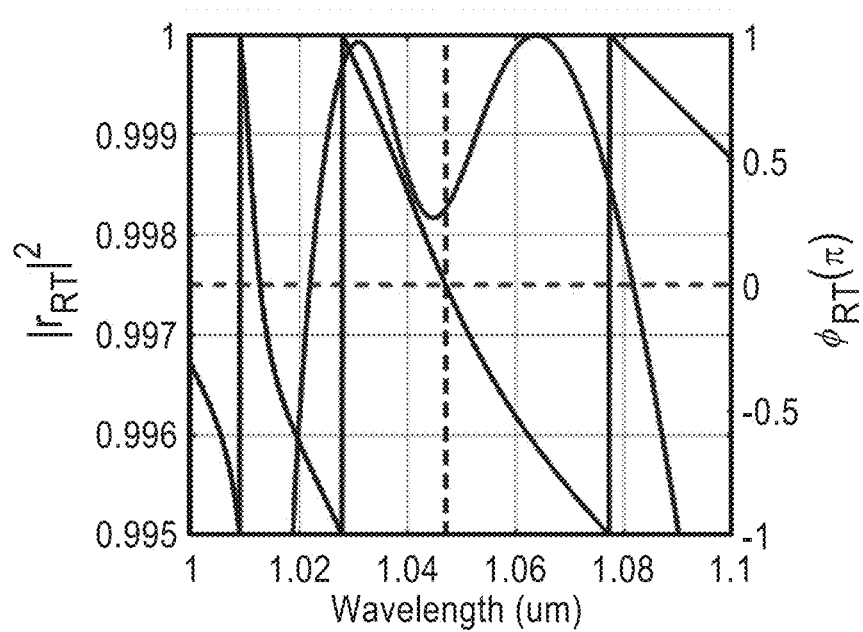
Figure 23C:
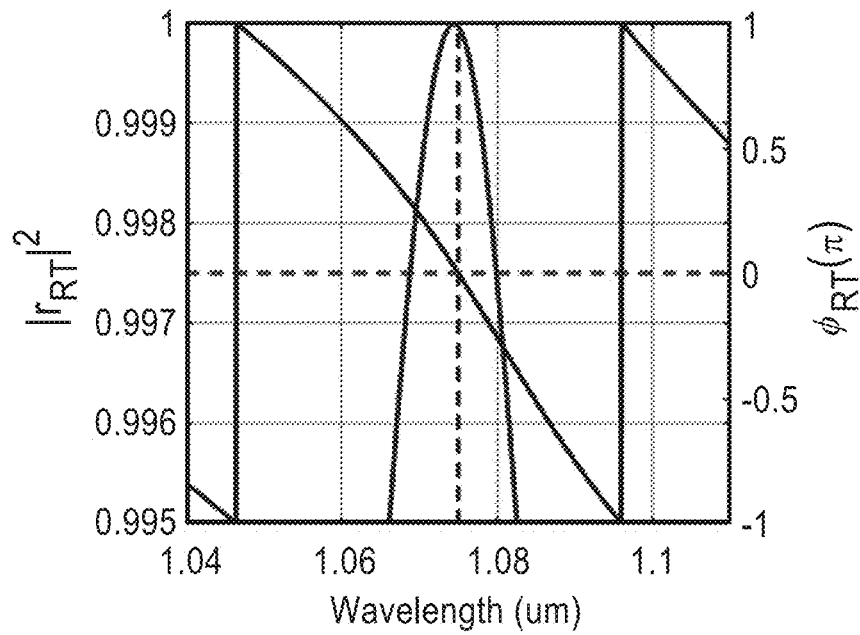
Figure 23D:
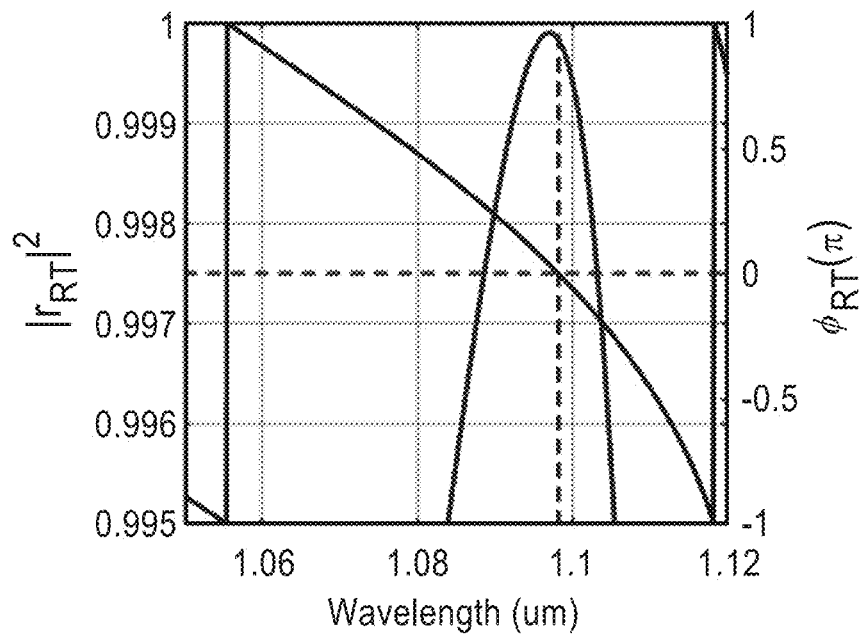

FIG. 22A through FIG. 22B depict results 810, 820 of experimentally significant improvements in VCSEL tuning range by applying our novel ACD design. Our conventional tunable 1060-nm VCSELs using the SCD design exhibited a 40 nm continuous tuning range, as shown in FIG. 22A, which agrees with our prediction in FIG. 17A. By changing the thickness of the SAC region, the SCD design becomes the ACD design, and the experimental tuning range is increased to 73 nm centered at 1060 nm, as shown in FIG. 22B. This leads to what currently appears a record-high relative tuning range of 6.89%, and is by far the largest demonstrated tuning range for electrically-pumped VCSELs that we have seen, while it also confirms the theoretical prediction in FIG. 17C.

FIG. 23A through FIG. 23D depict results 830, 840, 850 and 860 of changing the reflection phase of the hybrid top mirror by changing only the lateral parameters (period and duty cycle) of the HCG. In this way, a multi-wavelength VCSEL array is possible on a single chip. Since the ACD design supports a large FSR, short-wave wavelength-division multiplexing (SWDM) is now possible with our novel design. In FIG. 23A through FIG. 23D four designs are shown suitable for 4 channels in SWDM at 1025 nm, 1047 nm, 1075 nm, and 1098 nm. Here we use TE-HCGs with periods ranging from 720 nm to 842 nm and duty cycles ranging from 16% to 34%. The remaining VCSEL structure is the same as in FIG. 18A through FIG. 19C.

3.4. Notes and Conclusions

In this disclosure, the terms "quarter-lambda", "half-lambda", "one-lambda", and so forth for describing layer thicknesses all refer to effective wavelength in the corresponding layer, that is, free-space wavelength divided by the layer refractive index.

For one-lambda high-refractive index semiconductor cavity VCSELs, the top DBR preferably comprises integer pairs of low- and high-refractive index quarter-lambda layers, starting with a low-refractive index layer after the cavity, and finishing with a high-refractive index layer on top. The novel ACD design adds a SAC region on top of the top DBR. The SAC region starts with a quarter-lambda low-refractive index layer followed by a half-lambda window layer. The configuration type can also be identified by the shape of the tuning curves, as shown in FIG. 17A through FIG. 17C.

Optionally, the high-refractive index semiconductor cavity can be 1.5-lambda or two-lambda. Then the top DBR will comprise a non-negative integer number of pairs of low- to high-refractive index layers, and the SAC region is the same as previous.

Optionally, the semiconductor cavity can be low-index. In this case, the top DBR will comprise M+½ pairs of high- and low-refractive index layers, starting with a high-refractive index layer after the semiconductor cavity, and finishing with a high-refractive index layer. After the high-refractive index layer from the DBR, the SAC region design is the same as previous.

The thickness of the WL should be an integer multiple of half-lambda. The shapes of the tuning curves, the dominant resonance lines, and the FSRs are all insensitive to the WL thickness, as shown in FIG. 17A through FIG. 18C.

The ACD design is very robust in terms of the refractive index for the WL. The shapes of the tuning curves, the dominant resonance lines, and the FSRs are all insensitive to the WL refractive index ranging from 1.4 to 7.5, as shown in FIG. 19A through FIG. 19C.

By applying our new ACD design rule to conventional tunable VCSELs using the SCD design, the experimental tuning range increases from 40 nm to 73 nm.

In practical designs, intentional thickness variation up to around 20% for a few particular layers will be tolerable, with minimal changes on the tuning range and the type of configuration. For example, in both our SCD and ACD designs (with 40-nm and 73-nm experimental tuning ranges, respectively), the low-index oxidation layers ($Al_{0.98}Ga_{0.02}As$ and $Al_{0.9}Ga_{0.1}As$) above the high-index one-lambda cavity combine to be 0.191-lambda (23.6% deviation from quarter-lambda). In our practical SCD design, there is no WL and topmost "High 1" layer is 0.221-lambda (11.6% deviation from quarter-lambda). In our practical ACD design, the WL is 0.527-lambda (5.4% deviation from half-lambda). The reason for this adjustment is to compensate the deviation of the reflection phase from the HCG from 180 degrees, in order to make the tuning curve symmetric about the tuning center, as shown in FIG. 15.

Because of the large FSR provided by our new novel ACD designs, it is now possible to make multi-wavelength VCSEL arrays on a single chip, suitable for SWDM. By way of example and not limitation, we utilize four lateral designs of TE-HCG with a fixed HCG thickness at 633 nm on top of VCSELs with the ACD configuration. The four designs have the same epitaxial structure, and the lateral parameters (HCG periods and duty cycles) are controlled by e-beam lithography. The difference in reflection phase from HCG causes the VCSEL round-trip phases and resonance conditions to be different, while stilling maintaining high round-trip reflectivities (greater than 99.8 percent), as shown in FIG. 23A through FIG. 23D. The lasing wavelengths for the four channels are 1022 nm, 1047 nm, 1075 nm, and 1098 nm, respectively.

4. General Scope of Embodiments

Embodiments of the present technology may be described herein with reference to flowchart illustrations of methods and systems according to embodiments of the technology, and/or procedures, algorithms, steps, operations, formulae, or other computational depictions, which may also be implemented as computer program products.

From the description herein, it will be appreciated that the present disclosure encompasses multiple embodiments which include, but are not limited to, the following:

1. A tunable vertical-cavity surface-emitting laser (VCSEL) apparatus having a lasing wavelength with a tuning range, said apparatus comprising: (a) a semiconductor cavity and a movable reflector with an air cavity between the semiconductor cavity and movable reflector; (b) wherein lasing wavelength of said apparatus is controlled by resonance of said semiconductor cavity and resonance of said air cavity; (c) wherein the resonance of the semiconductor cavity is fixed; (d) wherein the resonance of said air cavity can be changed by moving said movable reflector; and (e) wherein said semiconductor cavity is configured for being antiresonant at a center of the tuning range for widening tuning range of said apparatus.

2. A tunable vertical-cavity surface-emitting laser (VCSEL) apparatus having a tuning range, the apparatus comprising: (a) a substrate; (b) a cavity structure having a one-lambda active cavity containing a multiple quantum well (MQW) gain region proximal said substrate; (c) a distributed Bragg reflector (DBR) containing an oxidation layer proximal said cavity structure; (d) a semiconductor-air coupling (SAC) layer proximal said distributed Bragg reflector (DBR); (e) a tunable air gap proximal said semiconductor-air coupling (SAC) layer; and (f) a highly reflective high-contrast grating (HCG) reflector suspended by a microelectromechanical system (MEMS) proximal said tunable air gap; (g) wherein the active cavity is configured to be antiresonant at a center of the tuning range for widening the tuning range of said apparatus.

3. A tunable vertical-cavity surface-emitting laser (VCSEL) apparatus having a tuning range, the apparatus comprising: (a) a substrate; (b) a highly reflective first distributed Bragg reflector (DBR) proximal said substrate; (c) a cavity structure having a one-lambda active cavity containing a multiple quantum well (MQW) gain region proximal said distributed Bragg reflector (DBR); (d) a second distributed Bragg reflector (DBR) containing an oxidation layer proximal said cavity structure; (e) a semiconductor-air coupling (SAC) layer proximal said second distributed Bragg reflector (DBR); (f) a tunable air gap proximal said semiconductor-air coupling (SAC) layer; and (g) a highly reflective high-contrast grating (HCG) reflector suspended by a microelectromechanical system (MEMS) proximal said tunable air gap; (h) wherein the active cavity is configured to be antiresonant at a center of the tuning range for widening the tuning range of said apparatus.

4. A tunable vertical-cavity surface-emitting laser (VCSEL) apparatus having a tuning range, the apparatus comprising: (a) a substrate; (b) a highly reflective first distributed Bragg reflector (DBR) layer disposed upon said substrate; (c) a semiconductor structure having a one-lambda active cavity containing a multiple quantum well gain region, wherein said semiconductor structure is disposed on said first distributed Bragg reflector (DBR) layer; (d) a second DBR layer containing an oxidation layer disposed on said semiconductor structure having said one-lambda active cavity; (e) a semiconductor-air coupling (SAC) layer disposed on said second distributed Bragg reflector (DBR) layer; (f) a tunable air gap; (g) a highly reflective distributed Bragg reflector (DBR) suspended by a microelectromechanical system (MEMS) disposed with said tunable air gap between said highly reflective distributed Bragg reflector (DBR) and said semiconductor-air coupling (SAC) layer; and (h) wherein said active cavity is configured for being antiresonant at a center of the tuning range for widening the tuning range of said apparatus.

5. A tunable vertical-cavity surface-emitting laser (VCSEL) apparatus having a tuning range, the apparatus comprising: (a) a semiconductor cavity; (b) a movable reflector disposed with an air cavity between said movable reflector and said semiconductor cavity; (c) wherein the apparatus has a free spectral range and tuning slope that are both increased in an air-cavity dominant design; and (d) wherein said semiconductor cavity is configured for being antiresonant at a center of its tuning range for widening the tuning range of said apparatus.

6. The apparatus of any preceding embodiment, wherein said movable reflector comprises a highly reflective tuning mirror.

7. The apparatus of any preceding embodiment, wherein said semiconductor cavity comprises an active cavity containing a gain material and a second highly reflective reflector.

8. The apparatus of any preceding embodiment, wherein said gain material comprises a multiple quantum well (MQW) structure.

9. The apparatus of any preceding embodiment, wherein said second distributed Bragg reflector (DBR) layer comprises a one quarter-lambda layer of AlGaAs layer containing an oxidation layer.

10. The apparatus of any preceding embodiment, wherein said first distributed Bragg reflector (DBR) comprises 38.5 pairs of alternating refractive index materials.

11. The apparatus of any preceding embodiment, wherein said second distributed Bragg reflector (DBR) comprises two pairs of alternating index materials.

12. The apparatus of any preceding embodiment, wherein said second distributed Bragg reflector (DBR) comprises one quarter lambda low index material with an oxidation layer.

13. The apparatus of any preceding embodiment, wherein the tunable vertical-cavity surface-emitting laser (VCSEL) has an emission wavelength determined by its resonant wavelength which is tuned by electrostatically displacing said high-contrast grating (HCG) reflector.

14. The apparatus of any preceding embodiment, wherein the tunable vertical-cavity surface-emitting laser (VCSEL) has an emission wavelength determined by its resonant wavelength which is tuned by thermal electrical tuning of said high-contrast grating (HCG) reflector.

15. The apparatus of any preceding embodiment, wherein the tunable vertical-cavity surface-emitting laser (VCSEL) has an emission wavelength determined by its resonant wavelength which is tuned by optomechanically tuning said high-contrast grating (HCG) reflector.

16. The apparatus of any preceding embodiment, wherein the semiconductor cavity has a round-trip phase that is an odd integer multiple of $\pi$ at the tuning center, constituting an antiresonance.

17. The apparatus of any preceding embodiment, further comprising (a) a semiconductor-air coupling (SAC) region upon said semiconductor cavity beneath said air cavity; and (b) wherein said semiconductor cavity is configured with an active cavity; and (c) wherein phase of reflection by said semiconductor-air coupling (SAC) region into the active cavity is an odd integer of $\pi$.

18. The apparatus of any preceding embodiment, wherein: (a) the semiconductor-air coupling (SAC) region comprises multiple layers; and (b) wherein if the overall phase of the reflection into the active cavity is $\pi$, then refractive index and thickness of individual layers does not significantly impact lasing operation of said apparatus.

19. The apparatus of any preceding embodiment, wherein said semiconductor-air coupling (SAC) region comprises a single $\lambda/4$ layer with refractive index greater than the square root of the refractive index of the active cavity.

20. The apparatus of any preceding embodiment, wherein said semiconductor-air coupling (SAC) region comprises a $\lambda/4$ layer with refractive index greater than the square root of the refractive index of the active cavity, over which is a λ/4 thick layer of low refractive index material.

21. The apparatus of any preceding embodiment, wherein said semiconductor-air coupling (SAC) region comprises a single 3λ/4 layer having a refractive index greater than the square root of the refractive index of the active cavity.

22. The apparatus of any preceding embodiment, wherein said semiconductor-air coupling (SAC) region comprises a single 3λ/4 layer having a refractive index greater than the square root of the refractive index of the active cavity, over which is a λ/4 thick layer of low refractive index material.

23. The apparatus of any preceding embodiment, wherein said semiconductor-air coupling (SAC) region comprises a λ/2 layer of arbitrary index material on top of, or beneath, a λ/4 layer of material having a refractive index greater than the square root of the refractive index of the active cavity.

24. The apparatus of any preceding embodiment, wherein said semiconductor-air coupling (SAC) region comprises a λ/2 layer of arbitrary index material on top of, or beneath, a λ/4 layer of material having a refractive index greater than the square root of the refractive index of the active cavity, over which is a λ/4 thick layer of low refractive index material.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A tunable vertical-cavity surface-emitting laser (VCSEL) apparatus having a tuning range, the apparatus comprising:
    (a) a substrate;
    (b) a reflective first distributed Bragg reflector (DBR) proximal said substrate;
    (c) a cavity structure having a one-lambda active cavity containing a multiple quantum well (MQW) gain region proximal said distributed Bragg reflector (DBR);
    (d) a second distributed Bragg reflector (DBR) containing an oxidation layer proximal said cavity structure;
    (e) a semiconductor-air coupling (SAC) layer proximal said second distributed Bragg reflector (DBR);
    (f) a tunable air gap proximal said semiconductor-air coupling (SAC) layer; and
    (g) a reflective high-contrast grating (HCG) reflector suspended by a microelectromechanical system (MEMS) proximal said tunable air gap;
    (h) wherein the active cavity is configured to be antiresonant at a center of the tuning range for widening the tuning range of said apparatus.

2. The apparatus of claim 1, wherein said second distributed Bragg reflector (DBR) layer comprises a one quarter-lambda layer of AlGaAs layer containing an oxidation layer.

3. The apparatus of claim 1, wherein said first distributed Bragg reflector (DBR) comprises 38.5 pairs of alternating refractive index materials.

4. The apparatus of claim 1, wherein said second distributed Bragg reflector (DBR) comprises two pairs of alternating index materials.

5. The apparatus of claim 1, wherein said second distributed Bragg reflector (DBR) comprises one quarter lambda low index material with an oxidation layer.

6. The apparatus of claim 1, wherein the tunable vertical-cavity surface-emitting laser (VCSEL) has an emission wavelength determined by its resonant wavelength which is tuned by electrostatically displacing said high-contrast grating (HCG) reflector.

7. The apparatus of claim 1, wherein the tunable vertical-cavity surface-emitting laser (VCSEL) has an emission wavelength determined by its resonant wavelength which is tuned by thermal electrical tuning of said high-contrast grating (HCG) reflector.

8. The apparatus of claim 1, wherein the tunable vertical-cavity surface-emitting laser (VCSEL) has an emission wavelength determined by its resonant wavelength which is tuned by optomechanically tuning said high-contrast grating (HCG) reflector.

9. A tunable vertical-cavity surface-emitting laser (VCSEL) apparatus having a tuning range, the apparatus comprising:
  (a) a substrate;
  (b) a reflective first distributed Bragg reflector (DBR) layer disposed upon said substrate;
  (c) a semiconductor structure having a one-lambda active cavity containing a multiple quantum well gain region, wherein said semiconductor structure is disposed on said first distributed Bragg reflector (DBR) layer;
  (d) a second DBR layer containing an oxidation layer disposed on said semiconductor structure having said one-lambda active cavity;
  (e) a semiconductor-air coupling (SAC) layer disposed on said second distributed Bragg reflector (DBR) layer;
  (f) a tunable air gap;
  (g) a reflective distributed Bragg reflector (DBR) suspended by a microelectromechanical system (MEMS) disposed with said tunable air gap between said highly reflective distributed Bragg reflector (DBR) and said semiconductor-air coupling (SAC) layer; and
  (h) wherein said active cavity is configured for being antiresonant at a center of the tuning range for widening the tuning range of said apparatus.

10. The apparatus of claim 9, wherein said second distributed Bragg reflector (DBR) layer comprises a one quarter-lambda layer of AlGaAs layer containing an oxidation layer.

11. A tunable vertical-cavity surface-emitting laser (VCSEL) apparatus having a tuning range, the apparatus comprising:
  (a) a semiconductor cavity;
  (b) a movable reflector disposed with an air cavity between said movable reflector and said semiconductor cavity;
  (c) wherein the apparatus has a free spectral range and tuning slope that are both increased in an air-cavity dominant design; and
  (d) wherein said semiconductor cavity is configured for being antiresonant at a center of its tuning range for widening the tuning range of said apparatus;
  (e) wherein the semiconductor cavity has a round-trip phase that is an odd integer multiple of $\pi$ at the tuning center, constituting an antiresonance;
  (f) a semiconductor-air coupling (SAC) region upon said semiconductor cavity beneath said air cavity, in which said semiconductor cavity is configured with an active cavity; and
  (g) wherein phase of reflection by said semiconductor-air coupling (SAC) region into the active cavity is an odd integer of $\pi$.

12. The apparatus of claim 11, wherein said semiconductor cavity comprises an entirety of said tunable vertical-cavity surface-emitting laser (VCSEL) excluding said movable reflector and said air gap.

13. The apparatus of claim 11:
  wherein the semiconductor-air coupling (SAC) region comprises multiple layers; and
  wherein if the overall phase of the reflection into the active cavity is $\pi$, then refractive index and thickness of individual layers does not significantly impact lasing operation of said apparatus.

14. The apparatus of claim 11, wherein said semiconductor-air coupling (SAC) region comprises a single $\lambda/4$ layer with refractive index greater than the square root of the refractive index of the active cavity.

15. The apparatus of claim 11, wherein said semiconductor-air coupling (SAC) region comprises a $\lambda/4$ layer with refractive index greater than the square root of the refractive index of the active cavity, over which is a $\lambda/4$ thick layer of low refractive index material.

16. The apparatus of claim 11, wherein said semiconductor-air coupling (SAC) region comprises a single $3\lambda/4$ layer having a refractive index greater than the square root of the refractive index of the active cavity.

17. The apparatus of claim 11, wherein said semiconductor-air coupling (SAC) region comprises a single $3\lambda/4$ layer having a refractive index greater than the square root of the refractive index of the active cavity, over which is a $\lambda/4$ thick layer of low refractive index material.

18. The apparatus of claim 11, wherein said semiconductor-air coupling (SAC) region comprises a $\lambda/2$ layer of arbitrary index material on top of, or beneath, a $\lambda/4$ layer of material having a refractive index greater than the square root of the refractive index of the active cavity.

19. The apparatus of claim 11, wherein said semiconductor-air coupling (SAC) region comprises a $\lambda/2$ layer of arbitrary index material on top of, or beneath, a $\lambda/4$ layer of material having a refractive index greater than the square root of the refractive index of the active cavity, over which is a $\lambda/4$ thick layer of low refractive index material.

* * * * *